(12) United States Patent
Tsuchida

(10) Patent No.: US 7,537,967 B2
(45) Date of Patent: May 26, 2009

(54) MOLD CLEANING SHEET AND MANUFACTURING METHOD OF A SEMICONDUCTOR DEVICE USING THE SAME

(75) Inventor: Kiyoshi Tsuchida, Yonezawa (JP)

(73) Assignees: Renesas Technology Corp., Tokyo (JP); Hitachi Yonezawa Electronics Co. Ltd., Yamagata (JP)

( * ) Notice: Subject to any disclaimer, the term of this patent is extended or adjusted under 35 U.S.C. 154(b) by 93 days.

(21) Appl. No.: 11/218,603

(22) Filed: Sep. 6, 2005

(65) Prior Publication Data

US 2005/0285306 A1      Dec. 29, 2005

Related U.S. Application Data

(63) Continuation of application No. 10/763,187, filed on Jan. 26, 2004, now abandoned, which is a continuation of application No. 10/086,691, filed on Mar. 4, 2002, now abandoned.

(30) Foreign Application Priority Data

May 18, 2001   (JP)   ............................. 2001-149827
Jul. 13, 2001   (JP)   ............................. 2001-213991

(51) Int. Cl.
      *H01L 21/00*       (2006.01)
(52) U.S. Cl. .................. 438/127; 438/112; 438/125; 438/126; 257/E21.504
(58) Field of Classification Search .................. 438/4, 438/106, 112, 126, 127, 125; 257/E21.504
See application file for complete search history.

(56) References Cited

U.S. PATENT DOCUMENTS 4,670,329 A * 6/1987 Pas .............................. 442/59
5,603,879 A    2/1997 Osada et al.

(Continued)

FOREIGN PATENT DOCUMENTS

JP      55087517 A  *  7/1980

(Continued)

OTHER PUBLICATIONS

Kanayuki Nakamura, Die-Cleaning Resin Product, English Translation; pp. 1-5.

(Continued)

*Primary Examiner*—Michelle Estrada
*Assistant Examiner*—Jarrett J Stark
(74) *Attorney, Agent, or Firm*—Mattingly & Malur, PC

(57) ABSTRACT

A cleaning sheet with frame for cleaning a molding die comprising a cleaning heat main body that covers the entire mating surface of a molding die and a reinforcing frame which can be disposed along the peripheral edge to the outside of the plural cavities of the mating surface of the molding die, the cleaning sheet main body being formed with first through holes at positions corresponding to the cavities of the molding die, air vent slits and flow cavity recesses at positions corresponding to the air vents of the cavities, second through holes at positions corresponding to the pots of the molding die, and slits at positions corresponding to the runners of the molding die, thereby capable of improving the cleaning effect of the molding die and shortening the time for the cleaning operation to improve the productivity.

6 Claims, 18 Drawing Sheets

U.S. PATENT DOCUMENTS

| | | | |
|---|---|---|---|
| 5,665,281 A * | 9/1997 | Drummond | 264/39 |
| 5,970,323 A | 10/1999 | Steijer et al. | |
| 6,077,360 A | 6/2000 | Takashima | |
| 6,228,688 B1 | 5/2001 | Ohta et al. | |
| 6,309,914 B1 | 10/2001 | Huang et al. | |
| 6,365,434 B1 | 4/2002 | Rumsey et al. | |
| 6,716,754 B2 | 4/2004 | Hofmann | |
| 6,787,093 B2 | 9/2004 | Kiritani | |
| 2001/0013424 A1 | 8/2001 | Takase et al. | |
| 2003/0131428 A1* | 7/2003 | Tsuchida | 15/104.93 |
| 2005/0285306 A1* | 12/2005 | Tsuchida | 264/272.15 |
| 2006/0194372 A1* | 8/2006 | Tsuchida | 438/124 |
| 2006/0197258 A1* | 9/2006 | Tsuchida | 264/272.17 |

FOREIGN PATENT DOCUMENTS

| | | | | |
|---|---|---|---|---|
| JP | 359-126440 | | | 7/1984 |
| JP | 2001/062846 | | | 7/1984 |
| JP | 61234536 | A | * | 10/1986 |
| JP | 1-95010 | | | 4/1989 |
| JP | 03-202327 | | | 9/1991 |
| JP | 03202327 | A | * | 9/1991 |
| JP | 03243310 | A | * | 10/1991 |
| JP | 04-173117 | | | 5/1992 |
| JP | 04173117 | A | * | 6/1992 |
| JP | 6-254866 | | | 9/1994 |
| JP | 06254866 | A | * | 9/1994 |
| JP | 07-304044 | | | 11/1995 |
| JP | 07304044 | A | * | 11/1995 |
| JP | 08-132446 | | | 5/1996 |
| JP | 09070856 | A | * | 3/1997 |
| JP | 2005014596 | A | * | 1/2005 |

OTHER PUBLICATIONS

Michio Nagata, Resin Molding Metallic Mold Cleaning Method, English Translation (Towa KK), pp. 1-21.

* cited by examiner

MOLD CLEANING SHEET AND MANUFACTURING METHOD OF A SEMICONDUCTOR DEVICE USING THE SAME

This is a continuation application of U.S. Ser. No. 10/763,187, filed Jan. 26, 2004 now abandoned, which is a continuation of U.S. Ser. No. 10/086,691, filed Mar. 4, 2002 (now abandoned).

BACKGROUND OF THE INVENTION

This invention concerns a semiconductor manufacturing technique and, more in particular, it relates to a technique effective to application for the improvement of the cleaning effect for cleaning inside a molding die for use in semiconductor devices, as well as improvement for the productivity.

The technique described below has been studied by the present inventors upon study and completion of the invention and the outline is as described below.

In the resin encapsulating step for resin encapsulation type semiconductor devices, since resin molding steps are repeated again and again, contaminants such as resin burrs, oxide films, oils or dusts are accumulated to an inside of a molding die in which an encapsulating resin is filled, that is, in the cavities and the runners, as well as the periphery of air vents and cull blocks of an upper die and a lower die forming a pair of molding dies.

Since such contaminants give undesired effects on the quality of molding and lower the releasability upon releasing of products from the molding die, an operator has to clean the molding die on every predetermined cycles of resin shots.

However, since cleaning for the molding die by the operator, being conducted by manual operation, requires a considerable period of time, a technique capable of cleaning the molding die in a short period of time has been demanded.

For coping with such a demand, Japanese Patent Laid-Open Hei 1(1989)-95010 discloses a cleaning method of clamping a lead frame not mounted with a semiconductor chip (hereinafter referred to as a dummy lead frame) between main surfaces (mating surfaces) of a molding die and injecting and hardening a cleaning resin formed, for example, of a melamine resin in the molding die, thereby depositing contaminants on the surface of the cleaning resin and removing the contaminants together with the cleaning resin.

Further, there is also a method of directly flowing a cleaning resin at a high pressure and a normal pressure into the cavity without using the dummy frame.

However, since an expensive dummy lead frame is used for cleaning in this technique, it is not economical, and a high accuracy is necessary for positioning the molding die and the dummy lead frame since the dummy lead frame of a predetermined shape adaptable to the molding die has to be set and clamped at a predetermined position of the molding die. Further, the cleaning resin formed in the cull portions or the runner portions are separated being detached from the lead frame and it requires a considerable time to remove the separated resin from the molding die to worsen the operation efficiency. Further, the separated culls and runners are put between the sliding portions of the molding apparatus to sometimes result in disorder.

In view of the above, for overcoming such problems, the techniques to be described below have also been proposed.

Japanese Patent Laid-Open Hei 6(1994)-254866 discloses a method comprising the steps of clamping a sheet-like material made of a cotton fabric (non-woven fabric) capable of impregnating and permeating a cleaning resin between opened molds, and filling a cleaning resin in a molten state into the cavity of closed molding dies.

As has been described above in the known literature, since a liquid cleaning resin is injected in a state where a sheet capable of impregnating and permeating a cleaning resin and a chemical is put between the main surfaces (mating surfaces) of upper and lower dies, the positioning accuracy required between the molding die and sheet can be lowered and the cleaning resin and the chemical penetrate also to portions where the sheet is put between the main surface of the upper and lower dies, thereby to conduct cleaning for the molding dies.

SUMMARY OF THE INVENTION

However, in the first mentioned technique, when the cleaning resin is filled in the cavity, the sheet-like member moves vertically (lift) in the cavity, by which the sheet-like member forms resistance to the flow of the cleaning resin to bring about a phenomenon that the cleaning resin does not prevail throughout the cavity.

As a result, this provides a problem that contaminants remain at the corners of the cavity to make the cleaning for the inside of the cavity insufficient.

The mating surface of the molding die is formed, at the corners of the outer periphery of the cavity, with concaved portions in communication therewith such as flow cavity (for receiving escaping air or encapsulating resin to the flow cavity to avoid inclusion of air from the gate or improve the balance of fillage of the encapsulating resin in the cavity) or air vents.

However, in the cleaning for the molding die by using the molding die cleaning sheet, the cleaning resin less goes around to the vicinity of the corners of the cavity and, as a result, the cleaning resin does not intrude into the flow cavity or air vent during cleaning and does not clean the flow cavity or air vent and, accordingly, this results in a problem for the insufficiency in the filling of the encapsulating resin to the cavity upon molding of products after the cleaning.

Further, when the encapsulating resin less goes around to the vicinity of the corners for the cavity, the cleaning resin is not entangled to the molding die cleaning sheet at portions corresponding to the vicinity of the corners for the cavity, so that the cleaning resin remains upon detaching the cleaning resin together with the molding die cleaning sheet from the mating surfaces of the molding die after the completion of the cleaning, to require much labour for the removal of the molding die cleaning sheet and the cleaning resin from the mating surfaces, and this particularly results in a problem that the cleaning resin clogs in the air vents of the upper and lower cavities in three directions except for the gates.

Further, at the mating surface of a molding die for conducting molding of an SOP (Small Outline Package) having an elongate encapsulation portion or QFN (Quad Flat Non-leaded Package) using a matrix frame, when the distance between the outer end of the cavity and the edge of the mating surface is relatively short (for example, 10 mm or less), the cleaning resin leaked from the cavity goes beyond the molding die cleaning sheet upon cleaning of the molding die and deposits on the lateral surface in contiguous from the mating surface of the molding die.

In such a case, it takes a long time to remove the cleaning resin deposited on the lateral side of the molding die and, as a result, this results in a problem of lowering the efficiency of the cleaning operation for the molding die.

Further, as described above, the cleaning method of adsorbing the contaminants by the melamine resin results in a problem that the sufficient cleaning effect can not sometimes be obtained.

This invention intends to provide a molding die cleaning sheet for improving the cleaning effect for the molding die and shortening the time for the cleaning operation thereby improving the productivity, as well as a method of a manufacturing a semiconductor device using the same.

The foregoing and other objects, as well as novel features of this invention will become apparent by reading the descriptions of the specification and the appended drawings.

The outline of the typical inventions among those disclosed in the present application are briefly explained below.

The molding die cleaning sheet according to this invention is disposed between a first mold and a second mold of a molding die and adapted to clean the molding die, and comprises: a cleaning sheet main body formed with first through holes corresponding to the cavities of the molding die, recesses corresponding to the air vents at each corner of the cavities, second through holes corresponding to the pots of the molding die and slits corresponding to the runners of the molding die; and a reinforcing member for supporting the cleaning sheet main body at the peripheral edge thereof.

A method of manufacturing a semiconductor device according to another invention of the present application comprises the steps of:

providing the molding die cleaning sheet having a cleaning sheet main body formed with first through holes corresponding to the cavities of the molding die, recesses corresponding to the air vents at each corner of the cavities and second through holes corresponding to the pots of the molding die, and a reinforcing member for supporting the cleaning sheet main body at the peripheral edge thereof; disposing the cleaning sheet main body over the entire mating surface of the molding die while corresponding the first through holes of the cleaning sheet main body to the cavities, the recesses to the air vents and the second through holes to the pots respectively and clamping the cleaning sheet main body by the first mold and the second mold; supplying a cleaning resin from the pots to the cavities and passing the cleaning resin through the second and the first through holes of the cleaning sheet main body thereby filling the resin in the cavities; and hardening the cleaning resin and then releasing the cleaning resin and the cleaning sheet main body from the molding die.

BRIEF DESCRIPTION OF THE DRAWINGS

FIG. 3A and FIG. 3B are views showing an example for the structure of a molding die cleaning sheet of Embodiment 1 according to this invention, in which FIG. 3A is a plan view and FIG. 3B is a cross sectional view taken along line A-A in FIG. 3A;

FIG. 10A and FIG. 10B are views showing an example for the structure of a molding die cleaning sheet of Embodiment 3 according to this invention in which FIG. 10A is a plan view and FIG. 10B is a cross sectional view taken along line B-B in FIG. 10A;

FIG. 14A, FIG. 14B and FIG. 14C are views showing the constitution of the molding die cleaning sheet shown in FIG. 13, in which FIG. 14A is a perspective view of a reinforcing frame, FIG. 14B is a perspective view of a cleaning sheet main body and FIG. 14C is an enlarged fragmentary plan view showing a portion D in FIG. 14B in an enlarged scale;

FIG. 16A, FIG. 16B and FIG. 16C are views showing the constitution of a molding die cleaning sheet as a modified example of the molding die cleaning sheet shown in FIG. 13, in which FIG. 16A is an outer perspective view of a cleaning sheet main body, FIG. 16B is an outer perspective view of a reinforcing member and FIG. 16C is an enlarged fragmentary cross sectional view for a portion E in FIG. 16B in an enlarged scale;

DETAILED DESCRIPTION OF THE PREFERRED EMBODIMENTS

Figure 1:
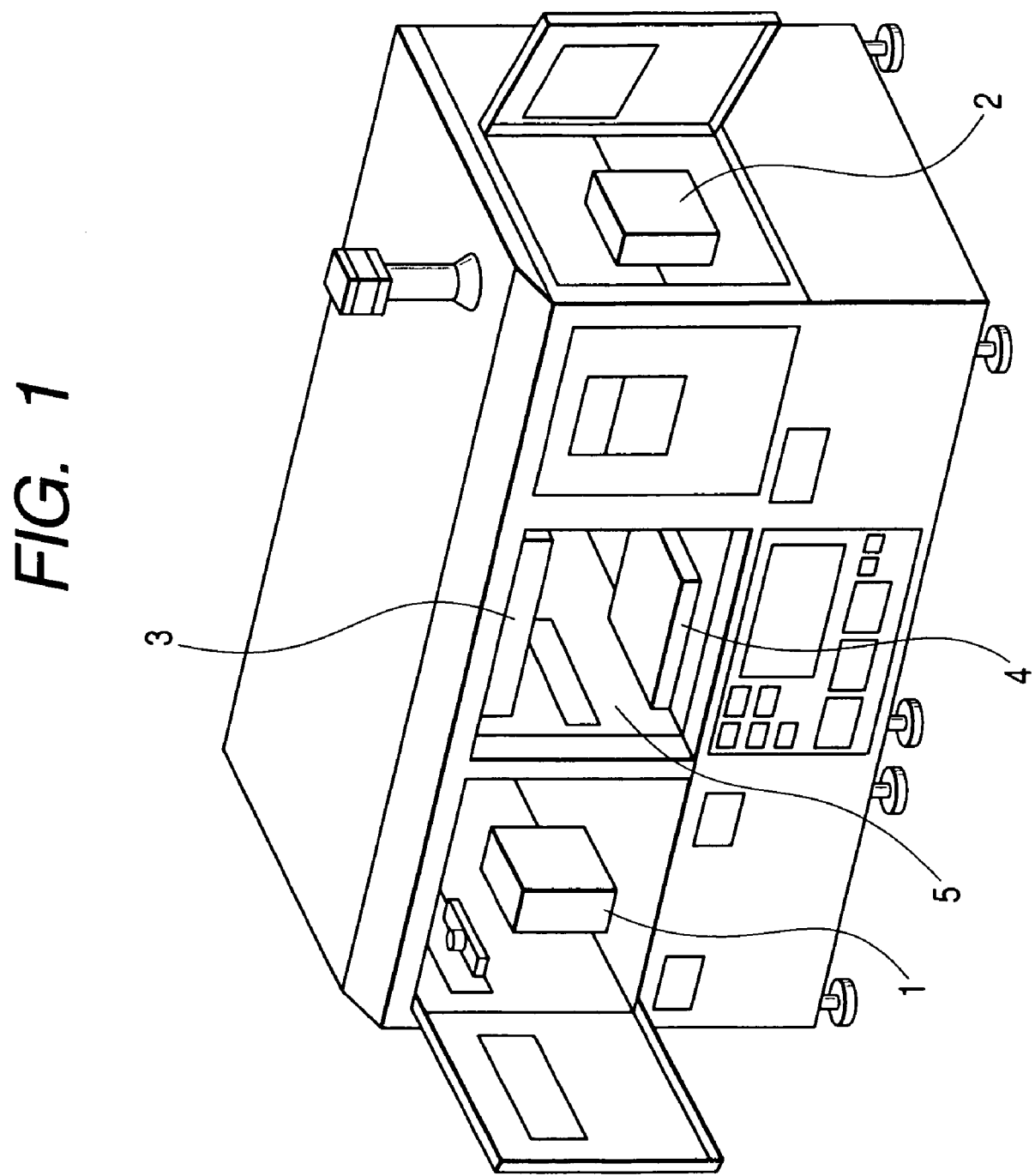
FIG. 1 is a perspective view showing an example for the structure of a transfer molding apparatus for conducting molding by using a molding die cleaning sheet of Embodiment 1 according to this invention.

In the following descriptions for the preferred embodiments, explanations for identical or similar portions are not repeated unless required.

Further, for the following preferred embodiments, explanation is to be made while dividing them into plural sections or embodiments if necessary for the sake of convenience, but they are concerned with each other unless otherwise specified and in such a relation that one constitute a partial or entire modification, details and explanatory explanation of the other.

Further in the following embodiments, when the number of elements (including numbers, numerical values, quantity and range) are to be mentioned, they are not restricted to the specified number and may be larger or smaller than the specified numbers unless otherwise specified or apparently restricted to specified numbers.

Embodiments of the invention are to be explained in details with reference to the drawings. Throughout the drawings for explaining the embodiments, those having identical functions carry the same reference numerals for which duplicate explanations are to be omitted.

Embodiment 1

Figure 2:
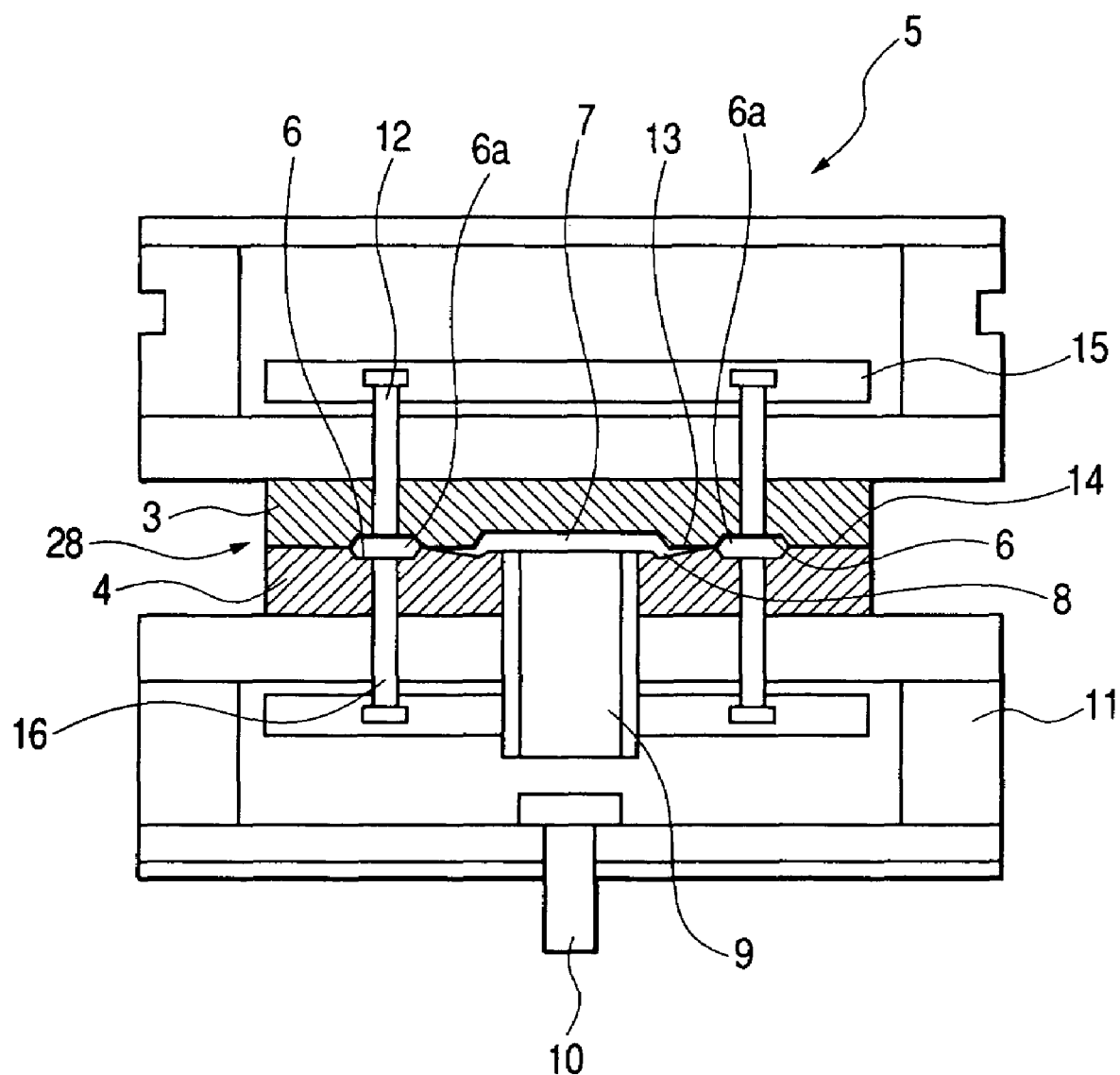
FIG. 2 is a fragmentary cross sectional view showing the structure of a resin molding section in the transfer molding apparatus shown in FIG. 1.
Figure 3A:
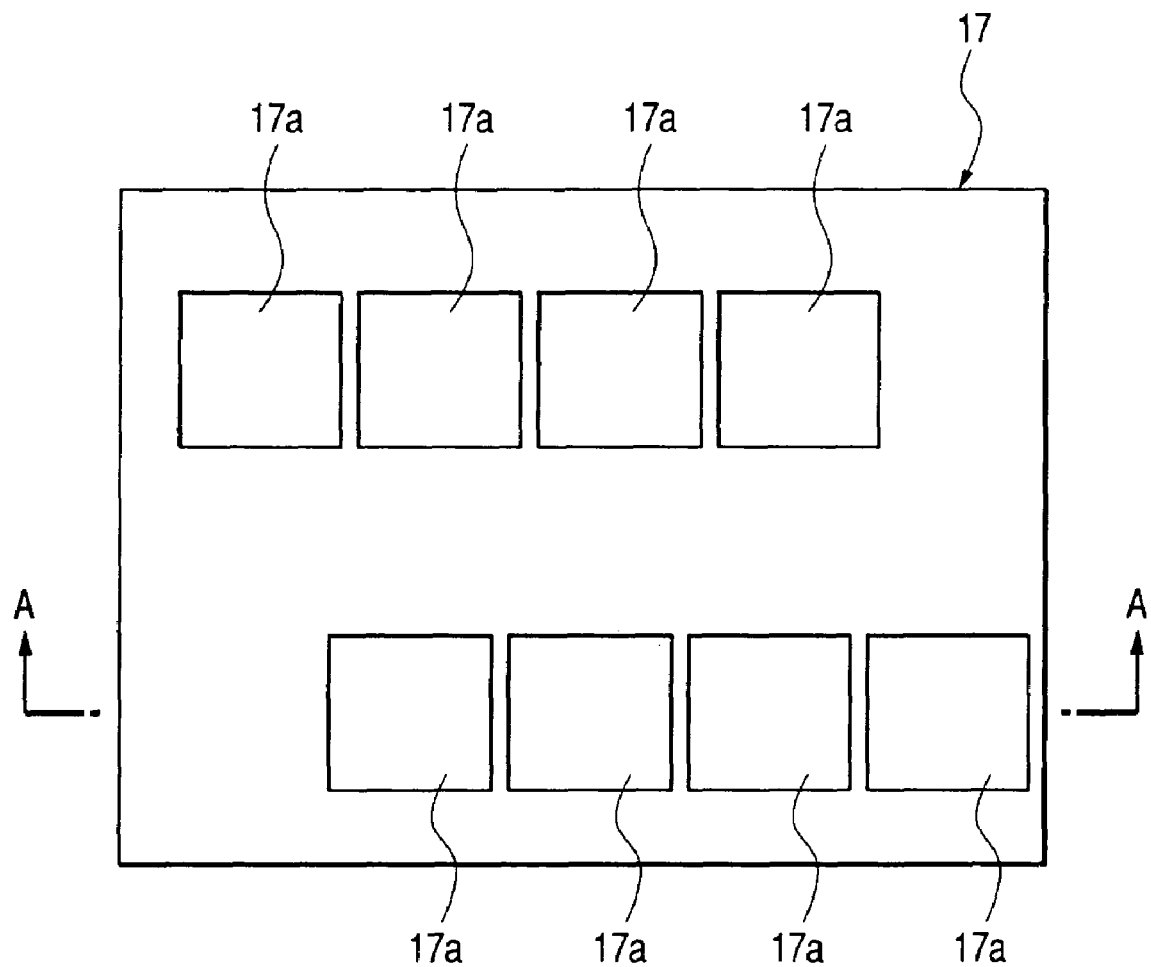
Figure 3B:
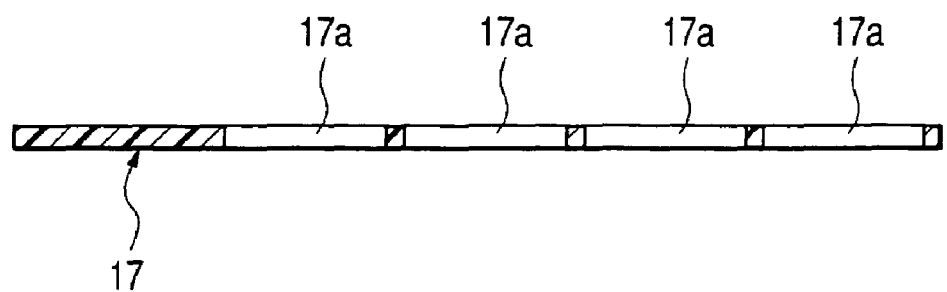
Figure 4:
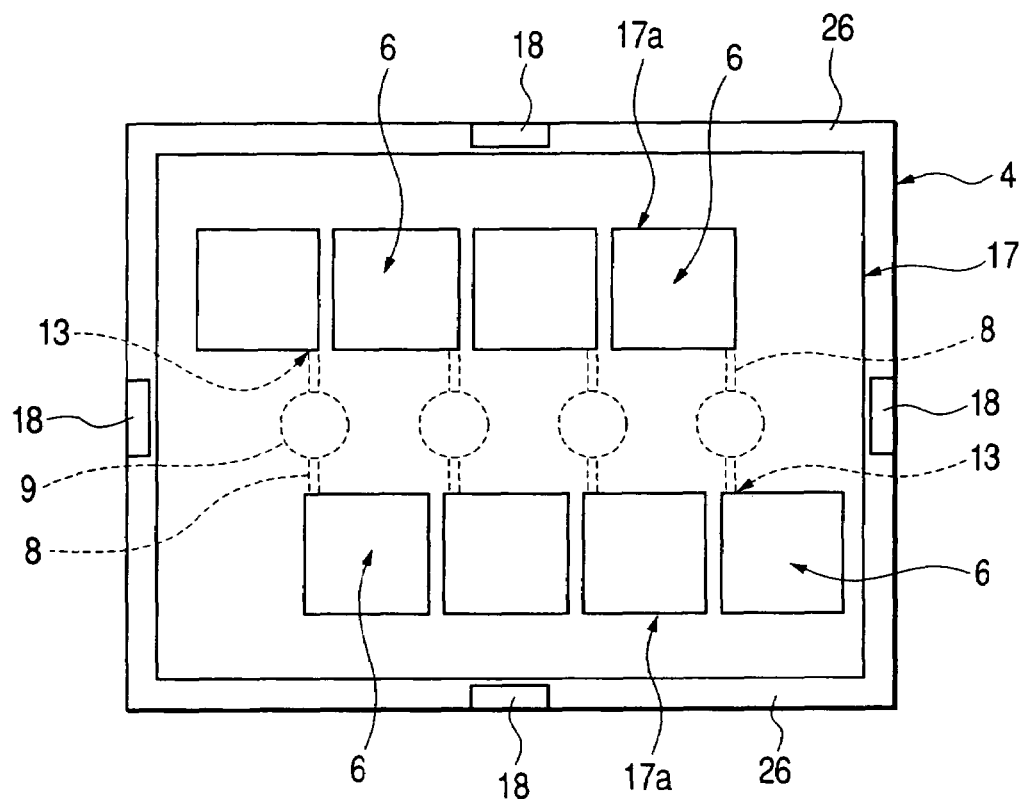
FIG. 4 is a plan view showing an example of a state where a molding die cleaning sheet is disposed at the mating surface of a second mold of the molding die disposed in a resin molding section.
Figure 5:
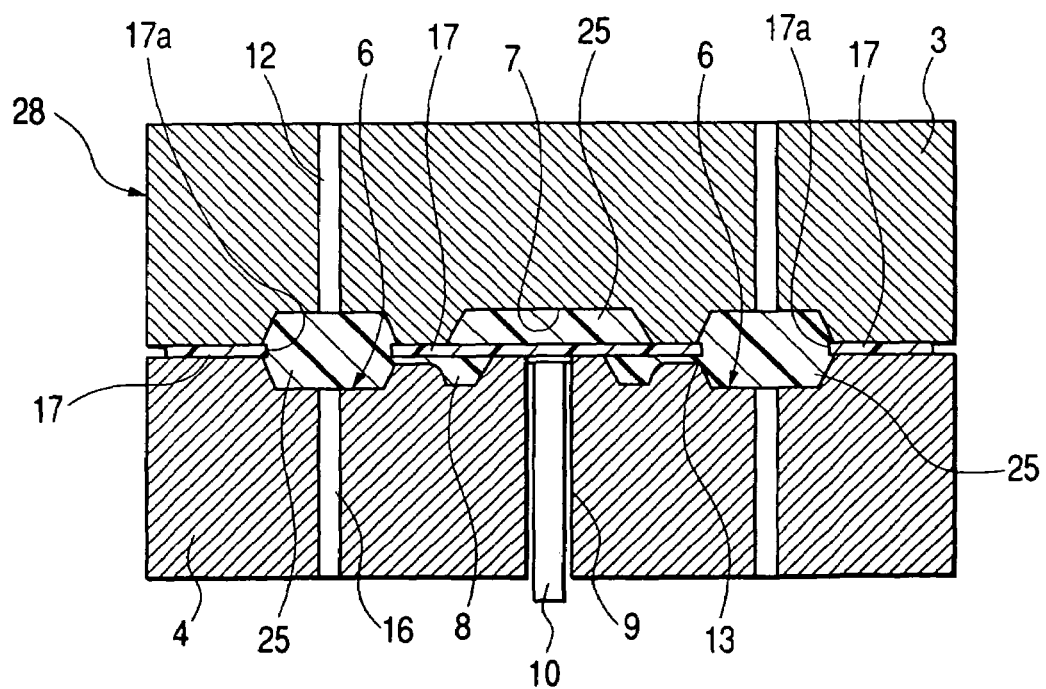
FIG. 5 is a fragmentary cross sectional view showing an example of a state for cleaning the inside of the molding die by using the molding die cleaning sheet shown in FIG. 3.
Figure 6:
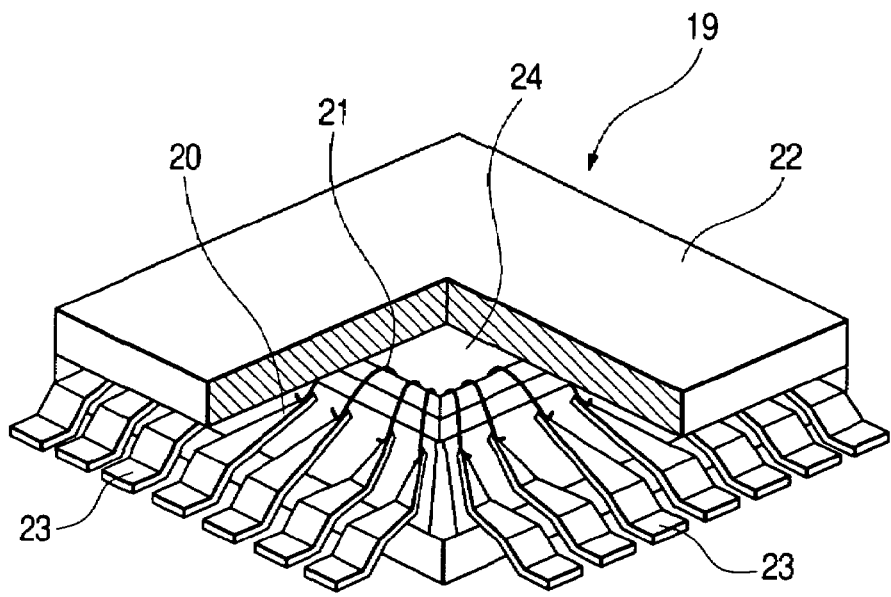
FIG. 6 is a perspective view partially in cross section of an example for the structure of a semiconductor device manufactured by a method of manufacturing a semiconductor device according to this invention.
Figure 19:
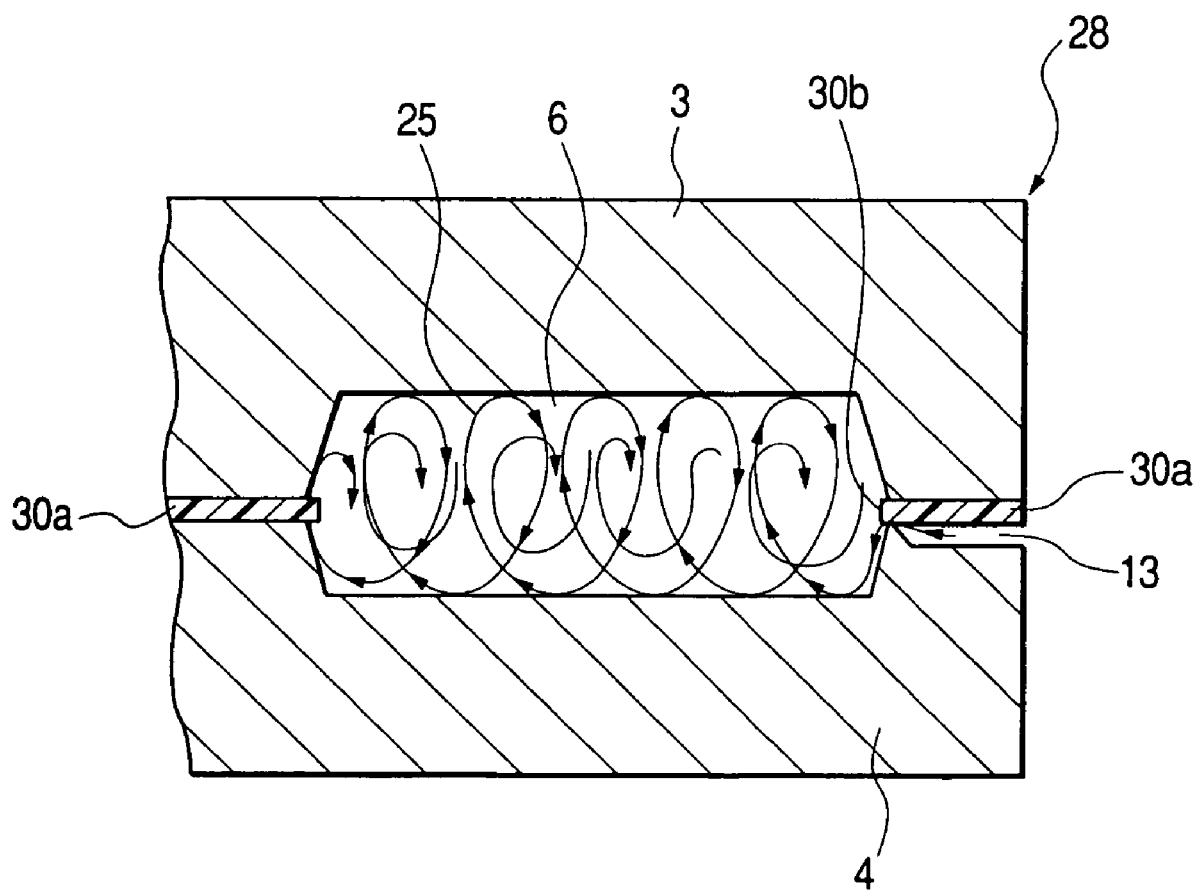
FIG. 19 is a cross sectional view, by a imaginary line, for an example of a flowing state of a cleaning resin in a cavity upon cleaning for the mold by using a molding die cleaning sheet according to this invention.
Figure 20:
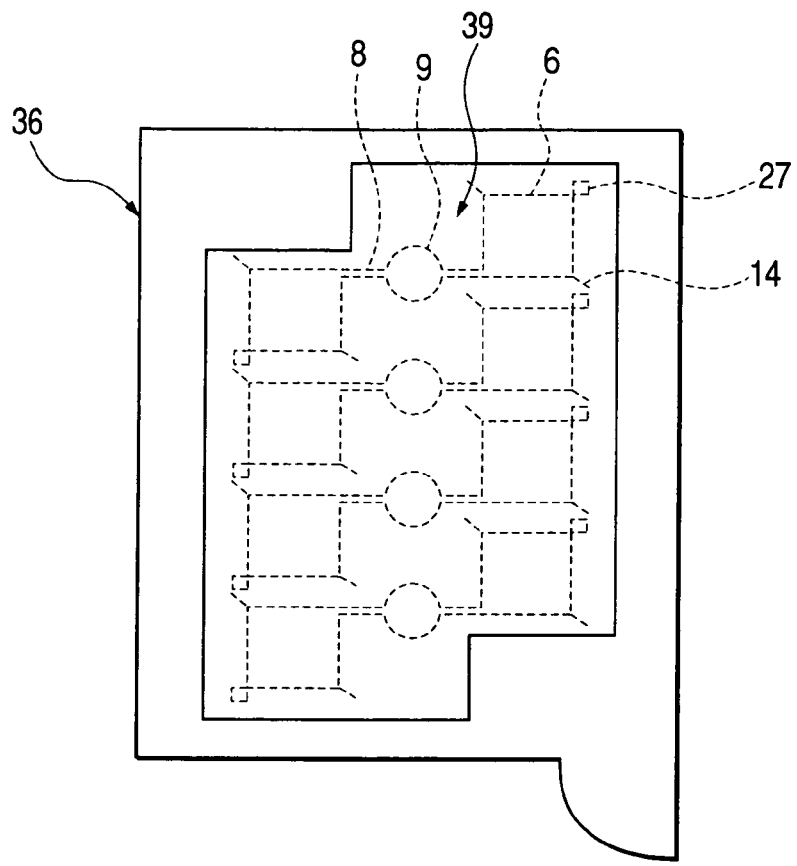
FIG. 20 is a plan view showing the structure of a molding die cleaning sheet as a modified example of Embodiment 1 according to this invention.
Figure 21:
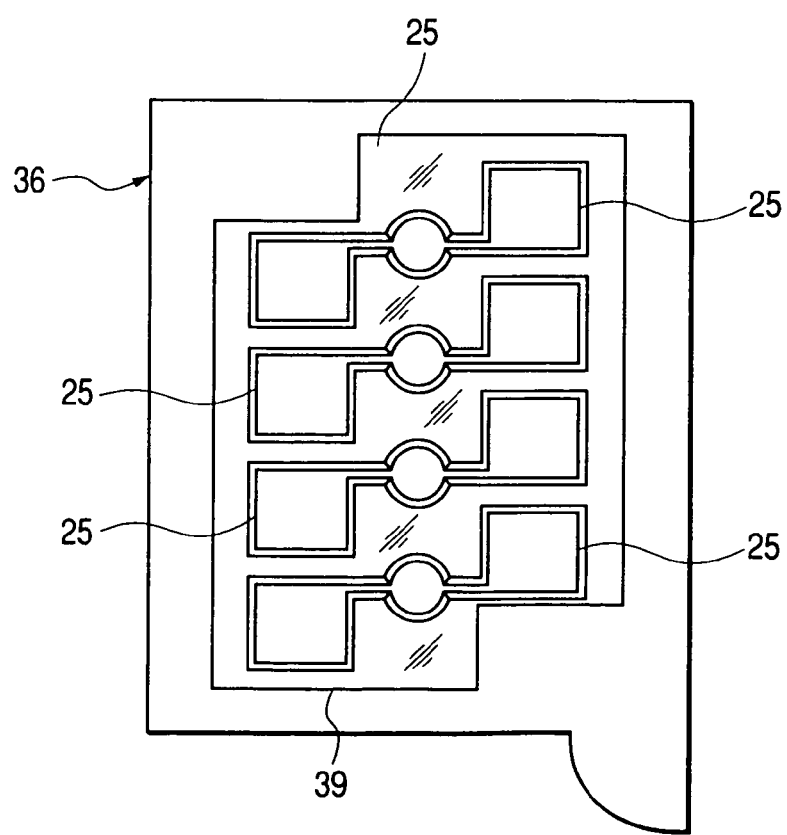
FIG. 21 is a plan view showing an example of a deposition state of a cleaning resin to a sheet when conducting cleaning for the mold by using the molding die cleaning sheet shown in FIG. 20.
Figure 22:
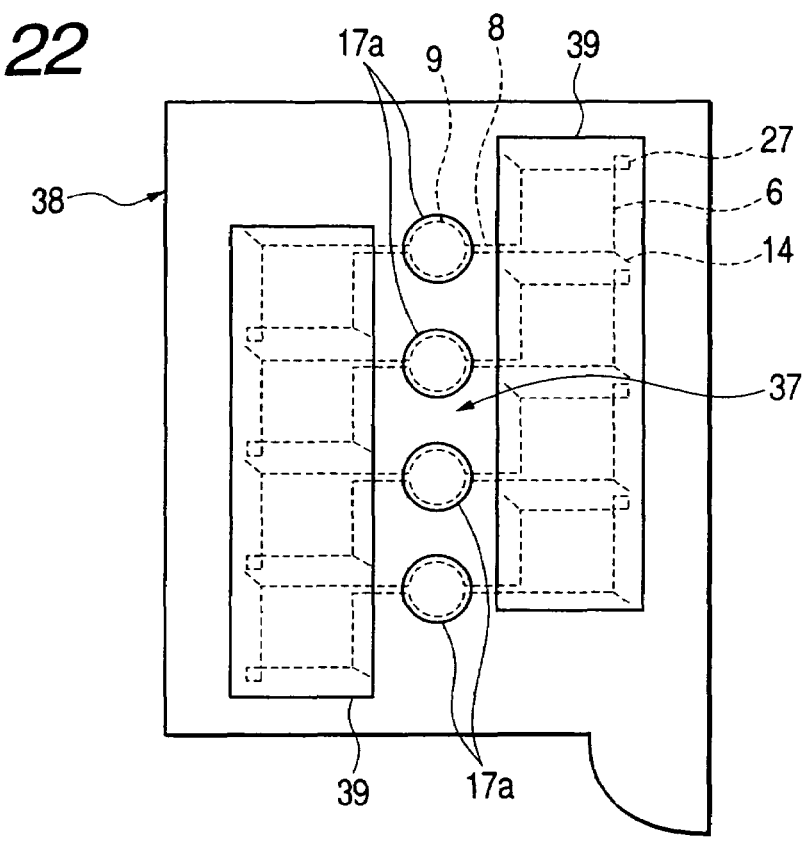
FIG. 22 is a plan view showing the structure of a molding die cleaning sheet as a modified example of Embodiment 1 according to this invention.
Figure 23:
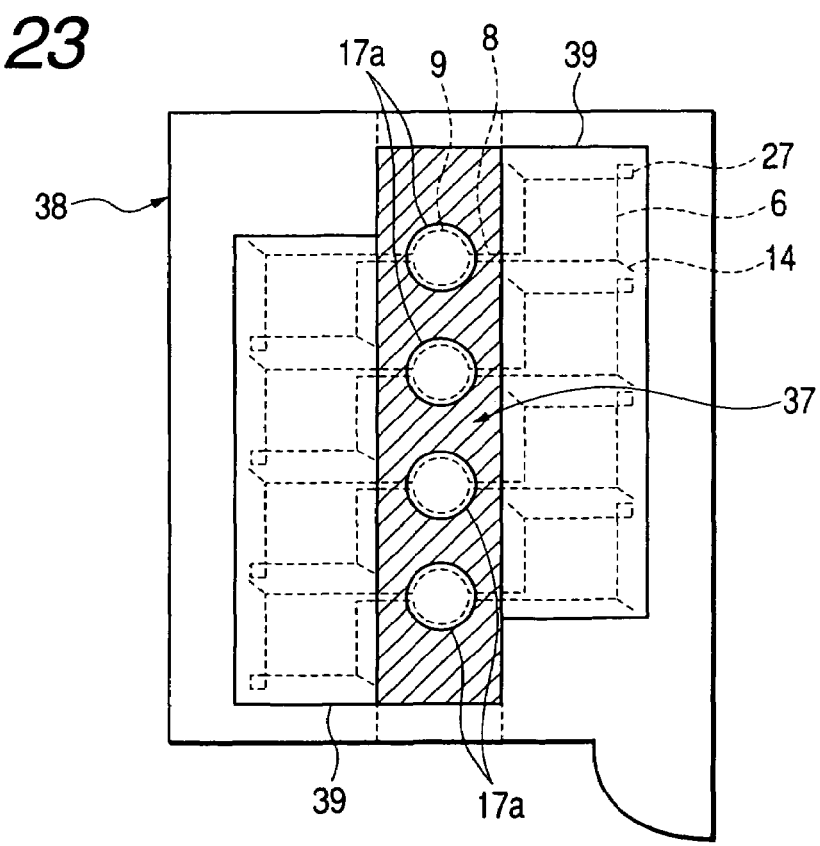
FIG. 23 is a plan view showing the structure of a molding die cleaning sheet as a modified example of Embodiment 1 according to this invention.

FIG. 1 is a perspective view showing an example for the structure of a transfer molding apparatus for conducting molding by using a molding die cleaning sheet of Embodiment 1 according to this invention; FIG. 2 is a fragmentary cross sectional view showing the structure of a resin molding section in the transfer molding apparatus shown in FIG. 1; FIG. 3A and FIG. 3B are views showing an example for the structure of a molding die cleaning sheet of Embodiment 1 according to this invention, in which FIG. 3A is a plan view and FIG. 3B is a cross sectional view taken along line A-A in FIG. 3A; FIG. 4 is a plan view showing an example of a state where a molding die cleaning sheet is disposed at the mating surface of a second mold of the molding die disposed in a resin molding section; FIG. 5 is a fragmentary cross sectional view showing an example of a state for cleaning the inside of the molding die by using the molding die cleaning sheet shown in FIG. 3; FIG. 6 is a perspective view partially in cross section of an example for the structure of a semiconductor device manufactured by a method of manufacturing a semiconductor according to this invention; FIG. 19 is a cross sectional view, shown by a imaginary line, for one embodiment of a flowing state of a cleaning resin in a cavity upon cleaning for the mold by using a molding die cleaning sheet according to this invention; FIG. 20 is a plan view showing the structure of a molding die cleaning sheet as a modified example of Embodiment 1 according to this invention; FIG. 21 is a plan view showing an example of a deposition state of a cleaning resin to a sheet when conducting cleaning for the mold by using the molding die cleaning sheet shown in FIG. 20; FIG. 22 is a plan view showing the structure of a molding die cleaning sheet as a modified example of Embodiment 1 according to this invention; and FIG. 23 is a plan view showing the structure of a molding die cleaning sheet as a modified example of Embodiment 1 according to this invention.

A transfer molding apparatus shown in FIG. 1 is a multi-pot type and used, for example, for resin-encapsulating a semiconductor chip 24 and inner leads 20 connected electrically with the semiconductor chip 24 as shown in FIG. 6.

The transfer molding apparatus includes a first mold 3 as an upper mold, a second mold 4 as a lower mold paired therewith, a resin molding section 5 having the first mold 3 and the second mold 4, a loader 1 for loading works (for example, lead frames after completion of die bonding and wire bonding) into the resin molding section 5 and an unloader 2 for unloading the works out of the resin molding section 5. In the transfer molding apparatus, a lead frame bonded with a semiconductor chip 24 (refer to FIG. 6), is loaded from the loader 1 shown in FIG. 1 to the resin molding section 5 and the semiconductor chip 24 and the like are resin-encapsulated in the resin molding section 5. A QFP (Quad Flat Package) 19 as a resin-encapsulated semiconductor device completed with resin molding is unloaded to and contained in the unloader 2.

Further, the resin molding section 5 shown in FIG. 2, are provided with cavities 6 each of a shape corresponding to an encapsulation portion 22 of the QFP 19 shown in FIG. 6, culls 7, runners 8, pots 9, a plunger 10, ejector plates 11, 15, ejector pins 12, 16, gates 13 and air vents 14.

Further, as shown in FIG. 4, cavities 6 each of a predetermined shape as a first concave, to which the semiconductor chip 24 is disposed, are formed at plural positions on the mating surface 26 of the second mold 4 of the molding die 28 (refer to FIG. 2) (the cavities 6 are formed also on the mating surface 26 of the first mold 3 in the same manner as in the second mold 4).

Further, an encapsulating resin such as tablets is set at a predetermined position of the second mold 4, plural cylindrical pots 9 each having a second concave part are penetrated, and the culls 7 are disposed as shown in FIG. 2, corresponding to the pots 9 at the respective portions of the first mold 3.

Further, plural runners 8 with which the plural cavities 6 are made to communicate are branched and formed from the culls 7 such that the upper side of the pots 9 is closed by the cull 7 and the pots 9 communicate with the plural cavities by way of the culls 7 and the runners 8 in a state where the first mold 3 and the second mold 4 are in intimate contact with each other. An air vent 14 is formed to the outside of each cavity 6 for releasing the air in the cavity 6 to the outside to complete the filling of the resin.

Then, a molding die cleaning sheet (hereinafter simply referred to as a cleaning sheet) 17 of the Embodiment 1 shown in FIG. 3 is to be explained.

The cleaning sheet 17 is disposed between the first mold 3 and the second mold 4 of the molding die 28 for cleaning the inside of the molding die 28 when molding for the semiconductor chip 24 is not conducted. When it is disposed between the first mold 3 and the second mold 4, it entirely covers the mating surfaces (parting surfaces other than the cavities) 26 of the molding die 28 and formed with through holes 17a corresponding to the cavities 6 of the molding die 28.

The through hole 17a formed in the cleaning sheet 17 of the Embodiment 1 is formed substantially in the same shape as the opening 6a of the cavity 6 (refer to FIG. 2).

That is, the through hole 17a is formed to a square shape which is substantially identical with or slightly smaller than that of the opening 6a of the cavity 6 in the first mold 3 and the second mold 4.

Thus, only the cleaning sheet 17 is clamped by the first mold 3 and the second mold 4 upon cleaning and a cleaning resin 25 shown in FIG. 5 is supplied to the cavities 6 in this state. Then, the cleaning resin 25 passes through the through holes 17a of the cleaning sheet 17 in the cavities 6 and, as a result, the cleaning resin is filled in the cavities 6 and the cleaning resin 25 is filled throughout the cavities 6 without lifting the cleaning sheet 17.

Accordingly, the inside of the cavity 6 can be cleaned completely.

Further, the cleaning sheet 17 of the Embodiment 1 has a size and a shape to entirely cover the mating surface 26 of the second mold 4 (also of the first mold 4) as shown in FIG. 4.

That is, the sheet is formed to such a size as guided by positioning wedges 18 disposed to the respective outer sides of the mating surface 26 of the second mold 4 for positioning the upper and lower molds. Accordingly, the cleaning sheet 17 can be placed on the mating surface 26 of the second mold 4, by merely placing the cleaning sheet 17 corresponding to the positioning wedges 18 on respective sides without requiring positioning at high accuracy with respect to the molding die 28.

Further, the cleaning sheet 17 in the Embodiment 1 formed, for example, of 100% paper, cloth or non-woven fabric having heat resistance and flexibility, and it is preferably composed of 100% non-woven cotton fabric.

Further, the thickness of the cleaning sheet 17 is about 0.2 mm upon clamping the first mold 3 and second mold and about 0.6 mm before clamping them.

Further, the QFP 19 shown in FIG. 6 is an example of a semiconductor device assembled by molding in the transfer molding apparatus shown in FIG. 1, and it includes bonding wires 21 for electrically connecting the electrodes of the semiconductor chip 24 and inner leads 20 corresponding thereto, an encapsulation portion 22 formed by resin encapsulating the semiconductor chip 24, the inner leads 20 and bonding wires 21, and plural outer leads 23 in connection with the inner leads 20 and projecting externally from the encapsulation portion 22 as external terminals, the respective outer leads 23 being formed each in a gull wing like shape.

A method of manufacturing a semiconductor device of the Embodiment 1 is to be explained.

The method of manufacturing the semiconductor device comprises a molding (resin-encapsulating) step for the semiconductor chip 24 using the transfer molding apparatus shown in FIG. 1 and a cleaning step for the inside of the molding die 28 of the transfer molding apparatus by using the cleaning sheet 27 shown in FIG. 3.

At first, in the wire bonding step, the semiconductor chip 24 and the inner leads of the lead frame as a work are electrically connected by way of the bonding wires 21.

Subsequently, in the molding step, the semiconductor chip 24, the inner leads 20 connected electrically with the semiconductor chip 24 and, further, the bonding wires 21 are resin-encapsulated with an encapsulating resin by using the transfer molding apparatus shown in FIG. 1.

The resin-encapsulating (molding) step in the molding step of the Embodiment 1 is to be explained.

At first, solid encapsulating resin (tablet) heated by a preheater is set over the plunger 10 shown in FIG. 2 and, subsequently, the leas frame in which the semiconductor chip 24 and the inner leads 20 are bonded is transported from the loader 1 to the resin molding section 5 shown in FIG. 1.

In this state, the second mold 4 is approached to the first mold 3 to form a space including the cavity 6 between the first mold 3 and the second mold 4 that constitute the molding die 28. Subsequently, when the encapsulating resin in a molten state is pushed out by the plunger 10 to the cull 7, the encapsulating resin flows through the runner 8 and the gate 13 into the cavity 6.

Further, the encapsulating resin filled in the cavity 6 is thermally set by heat and cure and, subsequently, the second mold 4 is moved downwardly to conduct mold opening.

Successively, the ejector plate 15 is moved downwardly and the ejector plate 11 is moved upwardly. Thus, ejector pins 12, 16 are protruded to complete mold opening and the resin encapsulated resin encapsulation type QFP (semiconductor device) 19 is taken out. Since several hundred cycles of resin shots are repeated per one day for the resin encapsulation, resin burrs and oxide films, or contaminants such as oils or dusts (deposits) are accumulated in the inside of the molding die 28 in which the encapsulated resin is filled, that is, on the mating surfaces between the first mold 3 and the second mold 4 (including periphery of the air vent 14, the cavity 6 and, further, the runner 8 and the cull 7).

Accordingly, for removing the contaminants, it is necessary to apply a cleaning step for the molding die 28 after the molding step.

Subsequently, cutting for the lead frame is conducted to the QFP 19 in a cutting step thereby completing assembling for the QFP 19 as shown in FIG. 6.

Successively, the cleaning step (method of cleaning the molding die) in the Embodiment 1 is to be explained.

At first, a cleaning sheet 17 which is formed of a non-woven fabric, covers the entire mating surface 26 of the molding die 28 and has through holes 17a corresponding to the cavities 6 of the molding die 28 shown in FIG. 3 is provided.

Successively, the mold temperature in the molding die is set, for example, to 170° C. to 180° C.

Subsequently, as shown in FIG. 4, the cleaning sheet 17 is placed over the entire mating surface 26 with the through holes 17a being corresponded to the cavities 6 and, in this state, the second mold 4 is approached to the first mold 3.

The cleaning sheet 17 is put and clamped between the first mold 3 and the second mold 4 by the approaching movement and, subsequently, the cleaning resin 25 is supplied to the cavities 6.

In this case, as shown in FIG. 5, the cleaning resin 25 is filled in the cavities 6 passing through the through holes 17a of the cleaning sheet 17 while prevailing throughout the inside of the cavities 6.

In this case, since a sheet capable of impregnating and permeating the cleaning resin 25 is used for the cleaning sheet 17, the cleaning resin 25 penetrates also to the portion of the cleaning sheet 17 put between the first mold 3 and the second mold 4 to provide a merit that the mating surface for the portions other than the pots 9 and the air vents 14 of the molding die 28 can also be cleaned simultaneously.

Successively, the cleaning resin 25 is hardened and, subsequently, the second mold 4 is moved downwardly to conduct mold opening by separating the first mold 3 and the second mold 4.

Further, the ejector plate 15 is moved downwardly and the ejector plate 11 is moved upwardly. Thus, ejector pins 12 and 16 are projected to complete the mold opening.

Subsequently, the cleaning resin 25 and the cleaning sheet 17 are released from the molding die 26.

That is, the cleaning sheet 17 and the cleaning resin 25 resin molded on the sheet are taken out.

Thus, the inside of the molding die 28 is cleaned.

In this case, since a sheet capable of impregnating and permeating the cleaning resin 25 is used as the cleaning sheet 17, the cleaning resin 25 that penetrates into fine portions such as the inside of the air vents or at the periphery of the cavities 6 between the mating surfaces 26 of the molding die 28 is also firmly entangled to the cleaning sheet 17, so that it can be removed reliably without being left on the mating surfaces 26 of the mold upon taking out the cleaning sheet 17.

This provides an outstanding effect, particularly, for removing burrs in plural air vents 14 present in the upper and lower molds.

After cleaning the inside of the molding die 28 by using the cleaning sheet 17 shown in FIG. 3, when operation (molding) is conducted again, the semiconductor chip 24 is disposed in the cavity 6 of the molding die 28 and, subsequently, the encapsulating resin is supplied to the cavity 6 and the semiconductor chip 24 is resin-encapsulated by the same method as the molding method described previously.

In a case where no sufficient cleaning effect can be obtained by adsorption of contaminants by the melamine resin, it is necessary to repeat the cleaning step by several cycles in order to ensure the cleanness on the main surface (mating surface 26) of the molding die. However, repeating of identical steps is troublesome and, in addition, no desired cleanness can be obtained sometimes depending on the nature of contaminants even by repeating the cleaning steps again and again.

In order to solve such a problem, higher cleaning effect can be obtained by adding hard particles (filler) to the cleaning resin 25. The filler entrained by the flow of the resin upon injecting the cleaning resin 25 collides against the surface of the molding die 28 and removes the contaminants on the surface of the molding die 28 to provide the cleaning effect. Higher cleaning effect can be obtained when the filler moves being entrained on the flow of the cleaning resin at a higher speed. For the material of the filler, silica or the like is appropriate.

However, such a cleaning effect by the collision of the filler can not be sufficient in a wide space such as in the opening 6a of the cavity 6 compared with that in a narrow portion in the flow channel of the cleaning resin 25 such as in the runner 8. This is attributable to that the flow rate of the cleaning resin 25 is lowered in a wide flow channel portion of the cleaning resin 25 even in a case where the cleaning resin 25 injected at an identical speed.

Further, such a cleaning effect by the filler for the cavity 6 is worsened extremely when a cleaning sheet 17 not having the through holes 17 at the portions corresponding to the openings 6a of the cavities 6 is used. This is because the flow resistance upon injection of the cleaning resin increases to lower the flow speed of the cleaning resin 25 by the presence of the cleaning sheet 17 across the opening 6a of the cavity 6.

Further, in a case where a soft cleaning sheet 17 such as made of a non-woven fabric is used, the cleaning sheet is sometimes localized to the first mold 3 or the second mold 4 by the injection under pressure of the cleaning resin 25, to extremely narrow the space between the main surface of the mold and the cleaning sheet 17, and the flow resistance is increased extremely at an extremely narrow space thus formed.

In the wide opening 6a of the cavity 6, since the cleaning resin 25 tends to pass through a flow channel at a lower flow resistance, the flow speed of the cleaning resin 25 is extremely lowered in the space narrowed by localization of the cleaning sheet 17 to the main surface of the mold, so that a desired cleaning effect by the collision of the filler is no more obtainable.

Then, in this embodiment, by the use of the cleaning sheet 17 having through holes 17a at the portions corresponding to the openings 6a of the cavities 6 and not having such a pattern as traversing the openings 6a, it is possible to decrease the flow resistance of the cleaning resin 25 in the openings 6a and provide a higher cleaning effect by the collision of the filler entrained by the turbulence of the cleaning resin 25 that has a high flowing speed and occurs at random as shown in FIG. 19.

When the filler is added to the cleaning resin 25, it is effective that the cleaning sheet 17 has a plurality of openings each having a diameter greater than that of the filler on one surface in order not to deteriorate the impregnating and permeating property for the cleaning resin 25.

Further, for lowering the flow resistance of the cleaning resin in the cavity 6, it is desirable that the through holes 17a formed in the cleaning sheet 17 has such a pattern that the cleaning sheet 17 does not traverse the inside of the cavity 6. However, the through holes 17a may be patterned such that the cleaning sheet 17 is disposed in the cavities so long as it is within such an extent as not remarkably increasing the flow resistance of the cleaning resin 25.

When it is intended to further enhance the cleaning effect by the filler, it is effective to lower the flow resistance of the resin in the resin injection channel between the pot 9 and the cavity 6, particularly, at the portion of the gate 13 where the cross section of the resin injection channel is smallest. For this purpose, it is desirable that the cleaning sheet has openings not only for the portions corresponding to the cavities 6 but also for the portions corresponding to the gates 13. For example, as shown in FIG. 20, a frame-like cleaning sheet 36 having an opening 39 in a region including pots 9, runners 8, gates 13, cavities 6, air vents 14, flow cavities 27 and a portion between the mold mating surfaces 26 between the cavities may be used.

Further, the shape of the frame-like part preferably has a function of not leaking the cleaning resin 25 out of the opening 39 upon injection of the cleaning resin 25.

There is no particular restriction on the material for the frame-like cleaning sheet 36 and the cost can be reduced by the use of material such as paper. Further, in order to prevent the cleaning resin 25 from leaking, it is desirable that the cleaning sheet 36 has such a frame shape as not having a gap (through hole or the like) larger than the diameter of the filler contained in the cleaning resin 25.

Further, since the cleaning sheet 36 is deformed flexibly in accordance with unevenness of the mold by the use of paper having lower modulus of elasticity compared, for example, with that of a Cu metal plate, leakage of the cleaning resin 25, for example, from the air vent portions can be prevented effectively also in the cleaning sheet 36 having a large opening and having a narrow frame-like shape. Further, it is possible to provide a general utilizability by using a flat cleaning sheet 36 without changing the fine unevenness of the mold, for example, change of the positions for the air vents.

Further, as shown in FIG. 21, after the injection step of the cleaning resin 25, the hardened cleaning resin 25 is removed together with the cleaning sheet 36 from the portion between the molds. It is preferred in this case to remove the cleaning resin 25 hardened between the mating surfaces 26 of the molds in the regions of the pots 9, runners 8, gates 13, cavities 6, air vents 14, flow cavities 27 and regions between the cavities in an integrated state in order to simplify the step of removing the cleaning resin 25.

However, when the strength of the resin hardened between the mold mating surfaces 26 is insufficient, the hardened cleaning resin 25 broken and disintegrated individually between the cavities 6 and 6, between the pot 9 and the cavity 6 or in the portion between the cavity 6 and the cleaning sheet 36 when the molds are opened or when the hardened cleaning resin 25 is removed from the mold.

In order to avoid the problem described above, it is necessary to increase the strength of the resin hardened between the mold mating surfaces 26. For this purpose, there is a method of increasing the thickness of the cleaning sheet 36 to thereby increase the thickness of the resin hardened between the mold mating surfaces 26. The thickness of the cleaning sheet 36 in this embodiment is, for example, 0.65 mm before putting between the molds and the thickness of the cleaning resin 25 hardened between the mold mating surfaces 26 is about 0.3 mm.

The numerical values for the thickness of the cleaning sheet 36 or the cleaning resin 25 are examples and not restricted only thereto. In order to keep the strength of the hardened cleaning resin 25, it is preferred that the thickness of the cleaning resin 25 hardened in the opening 39 even at the thinnest portion is preferably 1/10 or more of the resin hardened in the cavity.

Then, even when the thickness of the resin hardened between the mold mating surfaces 26 is controlled to 1/10 or more for the thickness of the cavity 6 as described above, in a case where the cull 7 is thick compared with the cavity 6, the cleaning resin 25 may sometimes be cracked due to the insufficient strength of the resin hardened between the mold mating surfaces 26.

In order to avoid such a problem, as shown in FIG. 22, it is effective to use a cleaning sheet 38 having a reinforcement 37 at the periphery of the cull 7. The reinforcement 37 may be formed with paper integrated with the frame part as shown in FIG. 22 but it may be also formed of a non-woven fabric as shown by the hatched region in FIG. 23.

In the cleaning sheet 36, since a resin injection speed can be obtained to some extent even between the mold mating surfaces 26 in a region between the cavity 6 and the cavity 6, improvement for the cleaning effect due to friction with the filler can be expected compared with the previous embodiment of disposing the cleaning sheet 36 between the mold mating surfaces 26. It is extremely effective in that the cleaning effect can be expected by the filler over the entire peripheral circumference of the cavity 6 severely contaminated particularly with the sealing resin.

The material for the cleaning sheet in this Embodiment 1 is required to have such a heat resistance as capable of enduring heat applied in the cleaning step. The temperature of heat applied to the cleaning step is about 180° C. in this embodiment.

However, a usual binder, for example, an acrylic resin used for making paper has a low heat resistance and may bring about a problem such as deformation of the cleaning sheet, adhesion to the molding die 28 or contamination of the molding die 28 by the binder melted by the heat in the cleaning step described to this embodiment.

In order to avoid such a problem, it is effective to use, for example, a non-woven fabric not using binder for the cleaning sheet, highly heat resistant material such as teflon, fluorine or polypropylene (PP) intended for heat resistant use as the binder, or to coat a cleaning sheet with a highly heat resistant material such as teflon or fluorine.

Further, a cleaning sheet coated at a frame with a mold releasing agent or impregnated at a frame with a releasing agent (oil, wax, etc.) is also effective.

This Embodiment 1 has been explained for the shot operation of a cleaning resin (melamine) 25 in the cleaning operation but it will be apparent that this is applicable also to the mold releasing recovery operation using a so-called releasing resin conducted after the operation (operation of conducting 5 to 7 shots of melamine resin, 2 shots of releasing recovery and two shots of product resin is referred to as cleaning operation)

According to the cleaning sheet for the molding die according to Embodiment 1 and the manufacturing method for the semiconductor device using the same, the following functions and effects can be obtained.

That is, since the cleaning resin 25 can pass the through holes 17a of the cleaning sheet 17 upon supplying and filling the cleaning resin 25 into the cavities 6 since the through holes 17a are formed corresponding in the cleaning sheet 17 corresponding to the cavities 6, the cleaning resin 25 can prevail throughout each cavity 6 without hindering the flow of the cleaning resin 25 in the cavity 6 irrespective of the filler contained in the cleaning resin 25 or the resin injection pressure.

As a result, contamination at the corners of the cavity 6 can also be removed by the cleaning resin 25 prevailing throughout the cavity 6.

This can conduct cleaning for the cavity 6 of the molding die 28 sufficiently and, accordingly, the cleaning effect can be improved.

Further, since the cleaning resin 25 formed by the cavities 6, the mating surfaces 26 (parting surfaces), culls 7 and gates 13 are joined by the cleaning sheet 17 that covers the entire mating surfaces 26 of the molding die 28 upon cleaning, when the cleaning sheet 17 is taken out after the hardening of the cleaning resin 25, it can be taken out integrally on the cleaning sheet 17 without being broken individually.

Accordingly, attachment and detachment of the cleaning sheet 17 to and from the molding die 28 can be conducted easily, by which the cleaning sheet 17 can also be treated easily even after the cleaning.

As a result, the time for the cleaning operation using the cleaning sheet 17 can be shortened.

Further, since the cleaning sheet 17 covers the entire mating surfaces 26 of the molding die 28, contamination can be removed at the inlet of the pot 9, at the periphery of the culls 7 and, further, in the air vents 14 of the molding die 28 by entangling the cleaning resin 25 to the cleaning sheet 17 and, as a result, resin burrs can be removed and the operation time can be shortened greatly.

Further, since the cleaning sheet 17 covers the entire mating surface 26 of the molding die 28, it is also possible to clean portions in the molding die 28 that are not in contact with the cleaning resin 25.

Further, since the entire mating surfaces 26 of the molding die 28 are covered by one cleaning sheet irrespective of the number of lead frames set in the molding die 28, positioning at high accuracy of the cleaning sheet 17 relative to the molding die 28 is no more required.

In this case, by the use of the cleaning sheet 17 formed of the non-woven fabric as in this Embodiment 1, it is no more necessary for the fabrication of positioning pins or fabrication of positioning pinholes relative to the molding die 28 as in the existent case of using the dummy lead frame.

Accordingly, the cost for the molding die 28 can be decreased.

Further, since the dummy lead frame is not used, deviated molding caused by the deviation of the dummy lead frame does not occur.

Further, since the mating surfaces 26 of the molding die 28 are entirely covered with one cleaning sheet, it may suffice to set one cleaning sheet 17 irrespective of the number of the lead frames set in the molding die 28 upon molding and, as a result, the cost for the cleaning operation can be decreased.

Further, since it is not required to use an expensive dummy lead frame for cleaning, by the use of the cleaning sheet 17 of this Embodiment 1, the cost of the cleaning operation for the molding die 28 can be decreased.

Further, since the cleaning sheet 17 has the through holes 17a corresponding to the openings 6a of the cavities 6, and the sheet entirely covers the mating surfaces 26 of the molding die 28 upon cleaning, it does not lowers the operation efficiency of the cleaning and can improve the cleaning effect.

Further, in the production process for a semiconductor device such as the QFP 19 in this Embodiment 1, since the time of the cleaning operation for the molding die 28 can be shortened greatly and the cleaning effect for the molding die 28 can be improved, the productivity of the semiconductor device can be improved.

Embodiment 2

Figure 7:
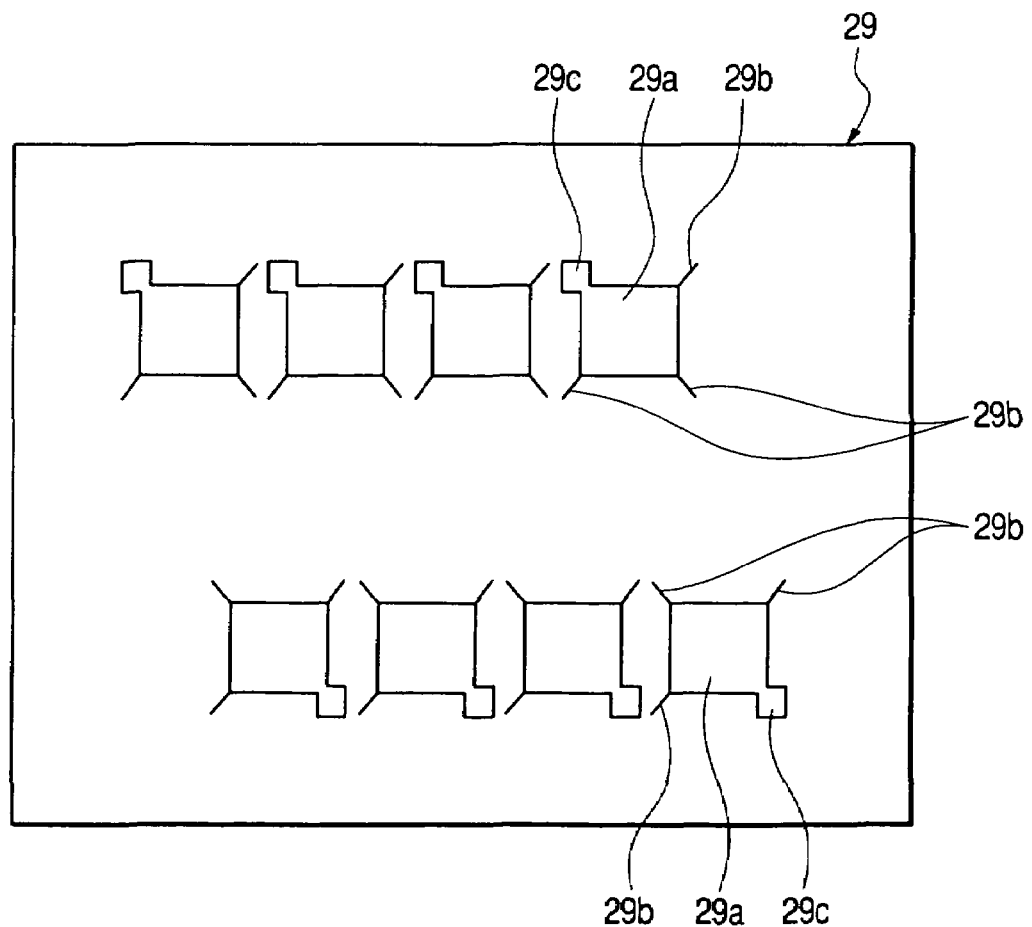
FIG. 7 is a plan view showing an example for the structure of a molding die cleaning sheet of Embodiment 2 according to this invention.
Figure 8:
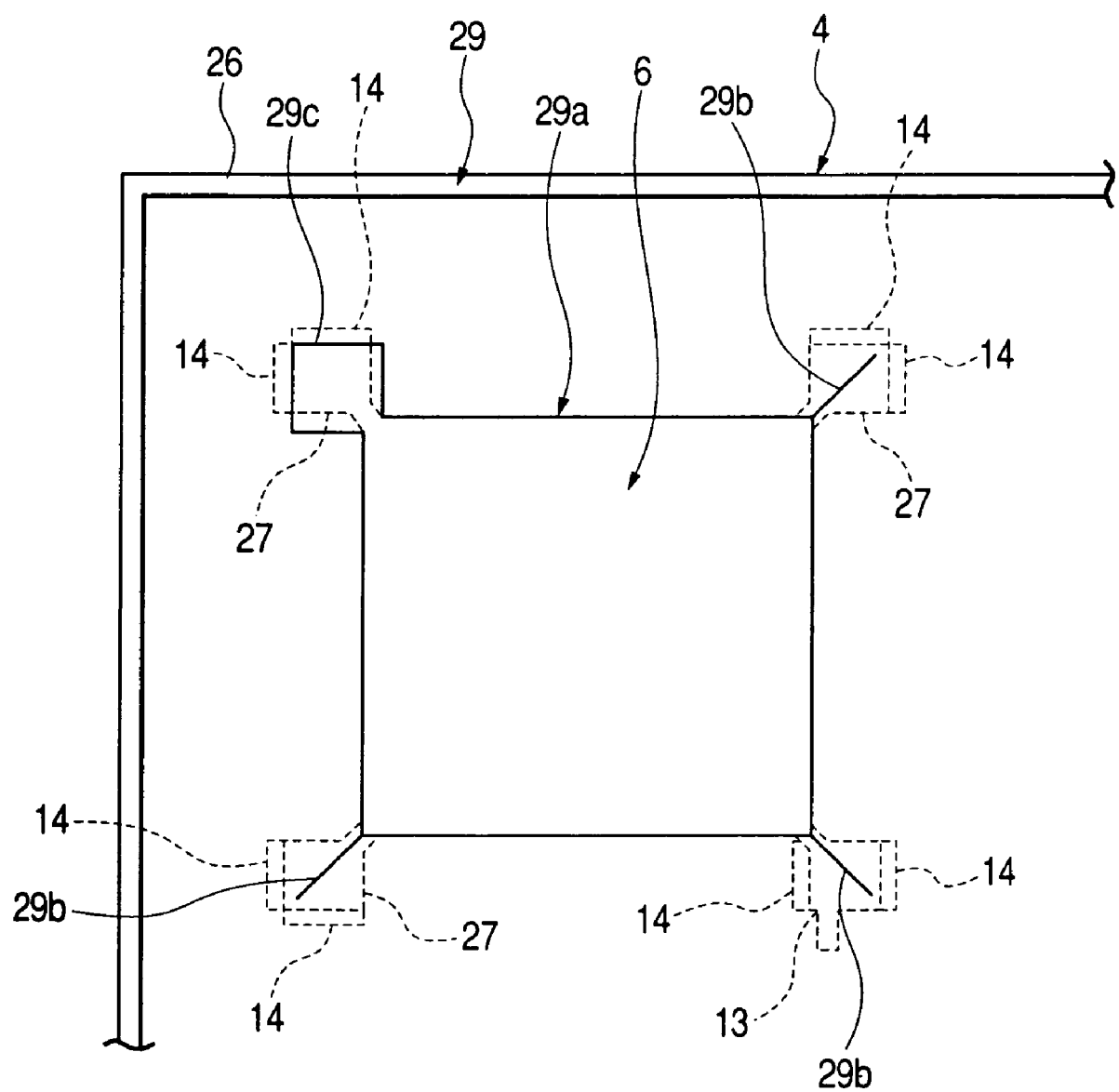
FIG. 8 is an enlarged fragmentary plan view showing an example of a state where the molding die cleaning sheet shown in FIG. 7 is disposed on the mating surface of the molding die.
Figure 9:
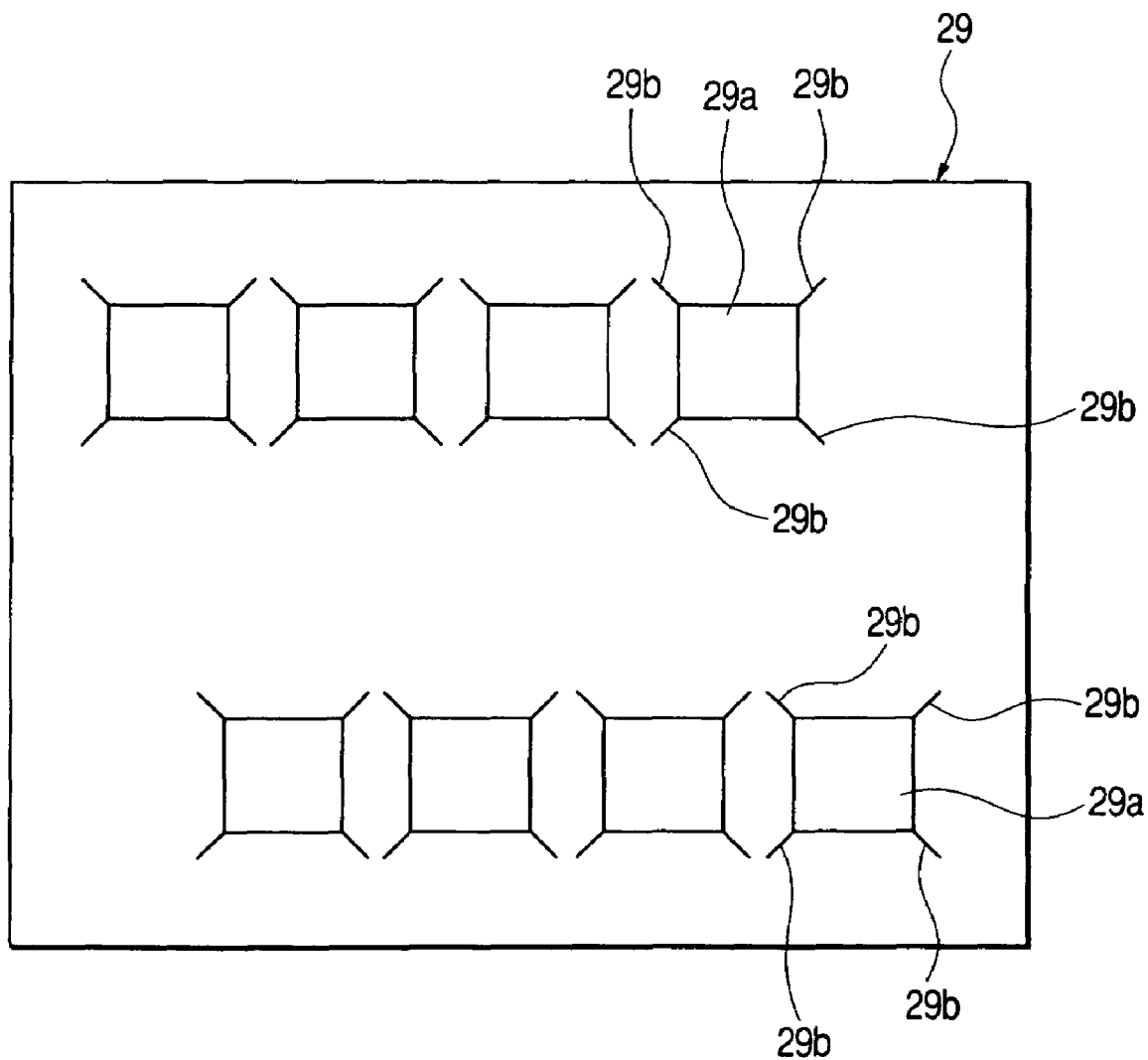
FIG. 9 is a plan view showing the structure for a molding die cleaning sheet as a modified example of the molding die cleaning sheet shown in FIG. 7.

FIG. 7 is a plan view showing an example for a structure of a molding die cleaning sheet in Embodiment 2 according to this invention, FIG. 8 is an enlarged fragmentary plan view showing an example of a state in which the molding die cleaning sheet shown in FIG. 7 is disposed at the mating surface of the molding die and FIG. 9 is a plan view for the structure of a molding die cleaning sheet as a modified example of the molding die cleaning sheet shown in FIG. 7.

In the Embodiment 2, description is to be made to a modified example of the molding die cleaning sheet used in the cleaning step of the molding die 28 shown in FIG. 2 in the semiconductor device manufacturing process explained for the Embodiment 1.

The cleaning sheet (molding die cleaning sheet) 29 shown in FIG. 7 is formed with through holes 29a at portions corresponding to the cavities 6 of the molding die 28 like that the cleaning sheet 17 explained for the Embodiment 1 and, in addition, formed with recesses such as slits 29b and flow cavity recesses 29c to the corners at the outer periphery of the through holes 29a.

The through hole 29a has a size substantially identical with or slightly smaller than that of the cavity 6 of the molding die 28.

Further, the slit 29b and the flow cavity recess 29c are formed at portions corresponding to flow cavities 27 (recess) in communication with the cavity 6 of the second mold 4 as shown in FIG. 8. Among them, the flow cavity recess 29c is a recess formed into substantially the same shape as that of the flow cavity 27.

The flow cavity 27 is used for escaping air or encapsulating resin in the cavity 6 into the flow cavity upon resin injection to avoid inclusion of air from the gate 13 or improve the filling balance of the encapsulating resin in the cavity 6.

Accordingly, the slits 29b and the flow cavity recesses 29c are used for completely filling the cleaning resin 25 shown in FIG. 5 to the flow cavity 27 which is a concaved portion communicating with the cavity 6 and the air vent 14 upon cleaning of the molding die 28.

That is, when the cleaning resin 25 is injected into the cavity 6, the cleaning resin 25 is passed through the through hole 29a of the cleaning sheet 29 into the cavity 6 and, further, the cleaning resin 25 passes through the flow cavity recess 29c and the slit 29b at the corners of the cavity 6 and flows into the flow cavity 27 and the air vent 14.

Thus, the cleaning resin 25 can be entangled to the cleaning sheet 29 by way of the flow cavity recess 29c and the slit 29b and, in this state, the cleaning resin 25 can be filled into the flow cavity 27 and the air vent 24.

As a result, the cleaning resin 25 after hardening thereof can be removed from the second mold 4 simultaneously with detachment of the cleaning sheet 29 from the molding die 28.

As to whether the slit 29b or the flow cavity recess 29c is formed as the recess, it is preferred to form the flow cavity recess 26c instead of the slit 29b since the cleaning resin 25 less flows to the flow cavity 27 situated remote from the gate 13 of the second mold 4.

Further, since the cleaning resin 25 tends to flow easily into the flow cavity 27 on the side of the gate 13, the slit 29b is formed in the corresponding portion.

Accordingly, in the modified embodiment shown in FIG. 7 and FIG. 8 (cleaning sheet 29 for QFP 19 shown in FIG. 6), the flow cavity recesses 29c is disposed only for the flow cavity 27 disposed at the place most remote from the gate 13 and slit 29b are formed for other three corners.

On the other hand, the modified embodiment (cleaning sheet 29 for BGA (Ball Grid Array)) in FIG. 9 shows a case where slits 29b are formed at four corners. There is no particular restriction on the corner of the cavity 6 to which the flow cavity recess 29c (refer to FIG. 7) or slit 29b is to be formed and there is also no particular restriction on the width and the length of the slit 29b or the shape of the flow cavity recess 29c.

The material and the thickness of the cleaning sheet 29 in the Embodiment 2 are identical with those for the cleaning sheet 27 of the Embodiment 1.

Other structures for the cleaning sheet 29 in the Embodiment 2 and a manufacturing method for the semiconductor device using the cleaning sheet 29 are identical with those for the manufacturing method of the semiconductor device using the cleaning sheet 17 explained for the Embodiment 1 and, accordingly, duplicate explanations therefor are omitted.

According to the cleaning sheet 26 of the Embodiment 2 and the manufacturing method for the semiconductor device using the same, when the cleaning resin 25 is injected to the cavities 6 upon cleaning of the molding die 28 shown in FIG. 2, the cleaning resin 25 can be passed through the slits 29b or the flow cavity recesses 29c of the cleaning sheet 29.

Then, it is possible to fill the cleaning resin 25 to the concave portions such as the flow cavity 27 or the air vent 14 and the cleaning resin 25 can be deposited being entangled to the cleaning sheet 29 by way of the recesses during cleaning.

Accordingly, since the cleaning resin 25 filled in the concave portions (flow cavity 27 and the air vent 14) of the mating surface 26 of the second mold 4 is removed by releasing the cleaning sheet 29 from the second mold 4 after hardening of the cleaning resin 25, the cleaning effect for the concaved portions can be improved and the cleaning resin 25 can be removed reliably together with the cleaning sheet 29 and, accordingly, the cleaning resin 25 can be removed easily from the concaved portions.

As a result, the cleaning time for the molding die 28 by using the cleaning sheet 29 can be shortened.

Further, when each recessed portion such as the flow cavity recess 29c or the slit 29b corresponding to the concaved portion opposing to the gate 13 of the second mold 4 (portion relatively remote from the gate 13) is made into a shape corresponding to the concaved portion, the cleaning effect for the concaved portion can be improved further.

Embodiment 3

Figure 10A:
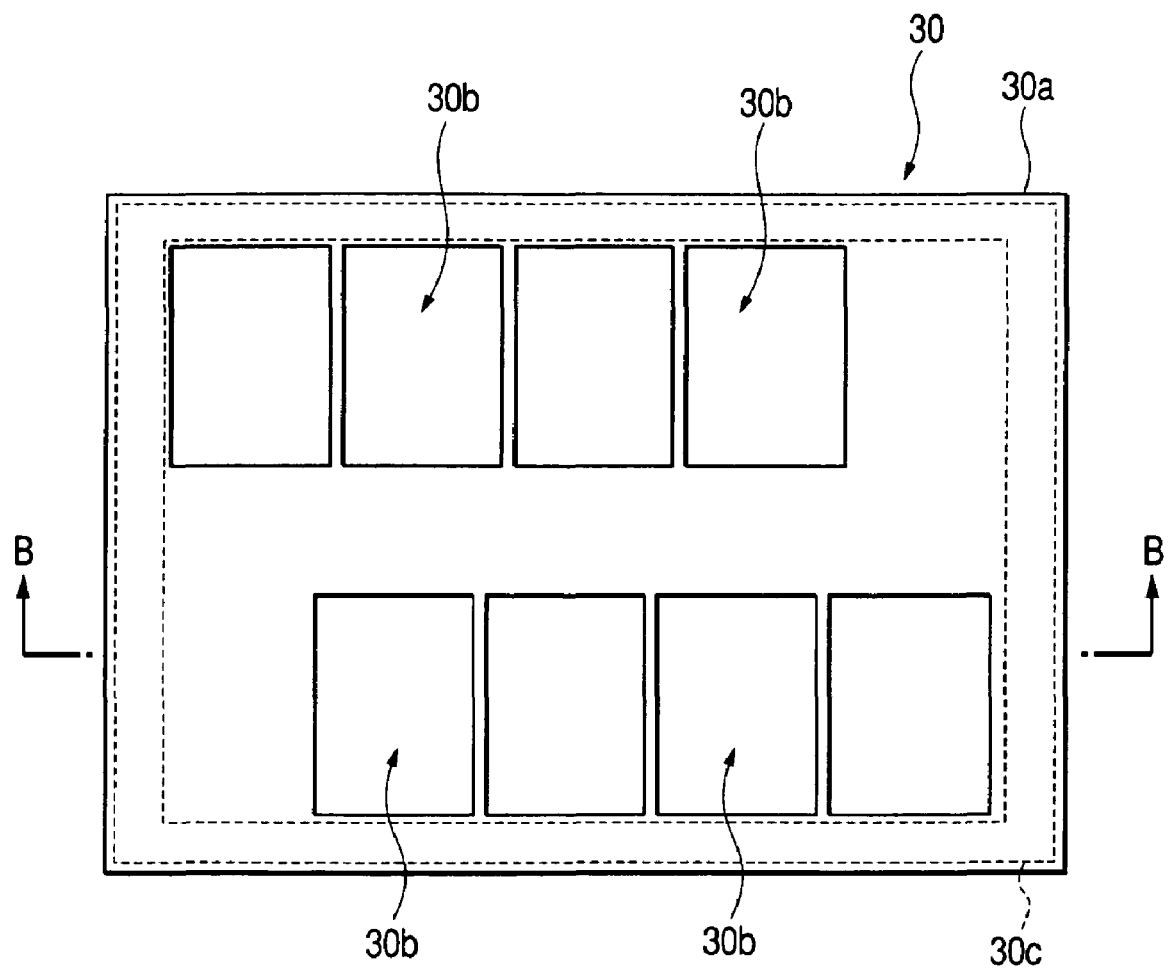
Figure 10B:
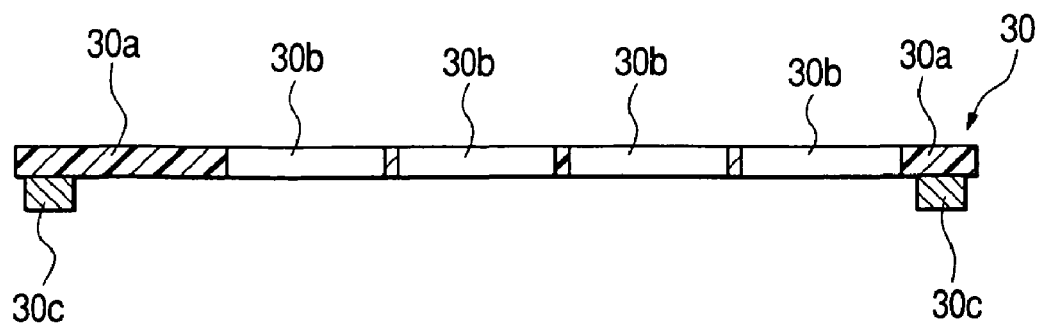
Figure 11:
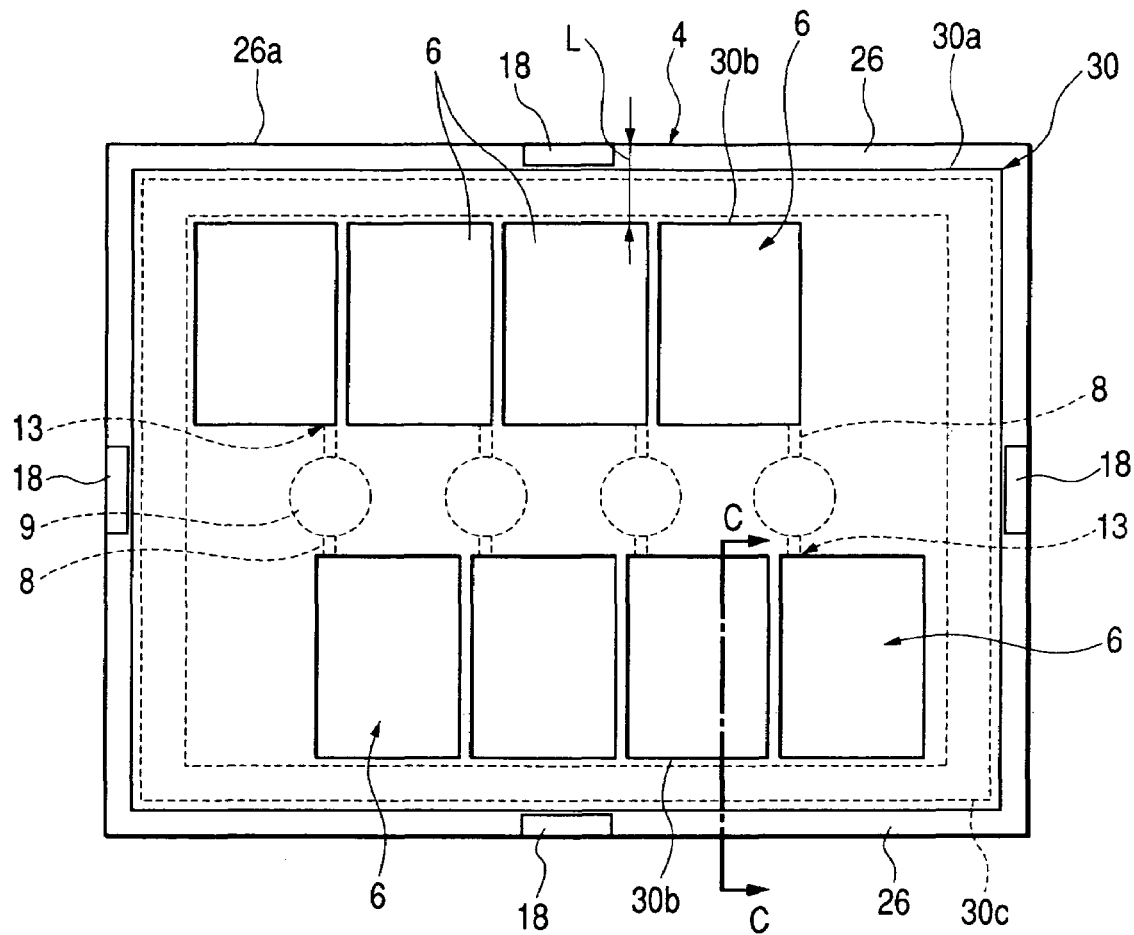
FIG. 11 is a plan view showing an example of a state where the molding die cleaning sheet shown in FIG. 10 is disposed on the mating surface of the molding die.
Figure 12:
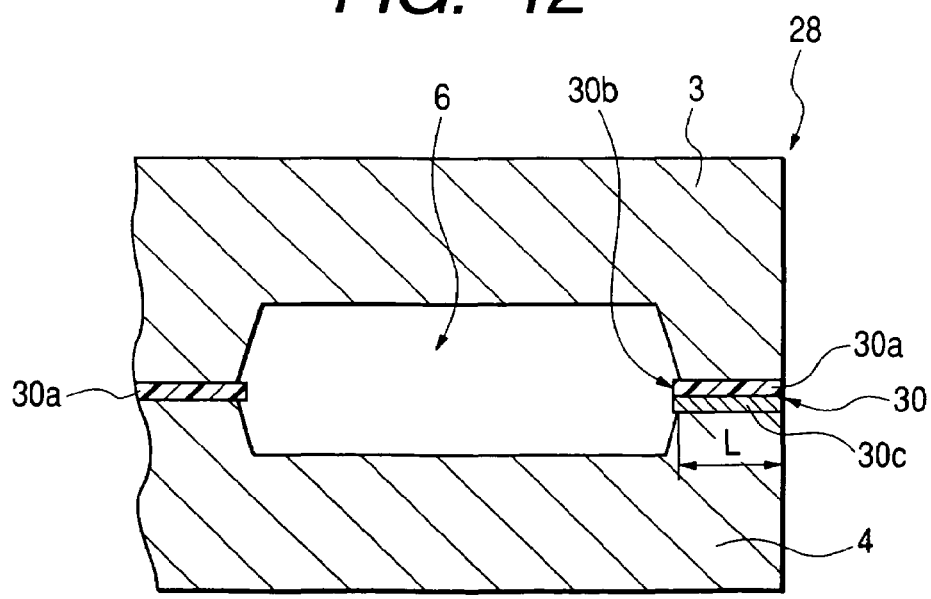
FIG. 12 is an enlarged fragmentary cross sectional view along line C-C shown in FIG. 11.

FIG. 10 is a view showing an example for a structure of a molding die cleaning sheet in Embodiment 3 according this invention in which FIG. 10A is a plan view, FIG. 10B is a cross sectional view taken along line B-B in FIG. 10A and FIG. 11 is a plan view showing an example of a state in which the molding die cleaning sheet shown in FIG. 10 is disposed on the mating surface of a molding die and FIG. 12 is an enlarged fragmentary cross sectional view taken along line C-C in FIG. 11.

In the Embodiment 3, explanation is to be made to a modified example of a molding die cleaning sheet used in the cleaning step for the molding die 28 shown in FIG. 2 in the manufacturing process for the semiconductor device as explained for the Embodiment 1 like that in Embodiment 2.

That is, a cleaning sheet with frame (molding die cleaning sheet) 30 shown in FIG. 10 comprises, like that the cleaning sheet 17 explained for the Embodiment 1, comprises a cleaning sheet 30a which covers the entire mating surface 26 of the molding die 28 and in which through holes 30b are formed at positions corresponding to the cavities 6, and a frame-like reinforcing sheet 30c which can be disposed along a circumferential periphery 26a of the mating surface 26 to the outside of plural cavities 6 in the mating surface 26 of the molding die 28.

The through hole 30b formed in the cleaning sheet 30a has a size about identical with or slightly smaller than that of the cavity 6 of the molding die 28.

The cleaning sheet 30 with frame in the Embodiment 3 is used to increase the clamping force at the outside of the cavity 6 upon clamping of the molding die 28 by the second mold 4 as a lower mold and the first mold 3 as an upper mold upon injection of the cleaning resin 25 (refer to FIG. 5) during cleaning for the molding die 28, as shown in FIG. 12, thereby preventing the cleaning resin 25 from leaking through the mating surfaces 26 of the molding die 28.

That is, as shown in FIG. 10, the cleaning sheet 30 with frame is formed by appending the cleaning sheet 30a formed with the through holes 30b corresponding to the cavities 6, and the frame-like reinforcing sheet 30c that can be disposed along the circumferential periphery 26a of the mating surface 26 to the outside of the plural cavities 6 of the mating surface 26 of the second mold 4.

Thus, upon cleaning the molding die 28, as shown in FIG. 11, the cleaning sheet 30a is disposed over the entire mating surface 26 with the through holes 30b of the cleaning sheet 30a being corresponded to the cavities 6, and the frame-like reinforcing sheet 30c is disposed to the mating surface 26 along the circumferential periphery 26a of the mating surface 26 to the outside of the plural cavities 6.

As shown in FIG. 10, in the cleaning sheet 30 with frame of the Embodiment 3, the cleaning sheet 30a and the reinforcing sheet 30c are previously appended and, accordingly, the cleaning sheet 30 with frame is disposed on the mating surface 26 of the second mold 4 upon conducting cleaning.

Then, as shown in FIG. 12, the cleaning sheet 30a and the reinforcing sheet 30c are clamped by the first mold 3 and the second mold 4 and, further, the cleaning resin 25 is injected into the cavities 6 in the clamped state as shown in FIG. 5 to fill the cleaning resin 25 into the cavities 6 and, after hardening the cleaning resin 25, the cleaning resin 25 is removed together with the cleaning sheet 30a from the mating surfaces 26 of the molding die 28 to conduct cleaning for the molding die 28.

In a case where a semiconductor device having a relatively elongate encapsulation portion 22 (refer to FIG. 6: although QFP 19 shown in FIG. 6 has a substantially square encapsulation portion 22) such as SOP or QFN using a matrix frame, when the distance between the outer end of the cavity 6 and the peripheral edge 26a of the mating surface 26 (L shown in FIG. 11 and FIG. 12) is relatively short on the mating surface 26 of the molding die 28 (for example L: 10 mm or less), the cleaning resin 25 leaked from the cavity 6 during cleaning for the molding die 28 may sometimes go beyond the molding die cleaning sheet and deposit on the lateral side in contiguous with the mating surface 26 of the molding die 28. Accordingly, the cleaning sheet 30 with frame shown in FIG. 10 is more effective to the cleaning for the molding die 28 for SOP or QFN in which L described above is 10 mm or less.

Preferably, the frame-like reinforcing sheet 30c has a thickness of about 0.1 to 0.2 mm and is formed, for example, of non-woven fabric, paper, copper or fluoro resin.

The cleaning sheet 30a and the reinforcing 30c may be appended previously to each other as in the cleaning sheet 30 with frame in the Embodiment 3, or both of the sheets may be provided separately without appending and they may be disposed successively on the mating surface 26 of the molding die 28 to conduct molding for cleaning.

Further, the cleaning sheet 30 with frame in the Embodiment 3 is effective also to semiconductor devices using a matrix frame other than SOP or QFN, or to BGA using a tape substrate.

The material and the thickness for the cleaning sheet 30a in the cleaning sheet 30 with frame in the Embodiment 3 are identical with those for the cleaning sheet 17 of the Embodiment 1.

Since the method of manufacturing the semiconductor device using the cleaning sheet 30 with frame in the Embodiment 3 is identical with the method for manufacturing the semiconductor device using the cleaning sheet 17 explained for the Embodiment 1, duplicate explanation therefor are to be omitted.

According to the cleaning sheet 30 with frame in the Embodiment 3 and the method of manufacturing the semiconductor device using the same, the cleaning sheet 30 with frame is disposed over the entire mating surface 26 with the through holes 30b of the cleaning sheet 30a being corresponded to the cavities 6, and the reinforcing sheet 30c is disposed to the mating surface 26 along the circumferential periphery 26a of the mating surface 26 to the outside of the plural cavities 6, and the cleaning sheet with frame is clamped between the first mold 3 and the second mold 4 of the molding die 28 to contact cleaning. Accordingly, clamping force of the molding die 28 can be improved and, as a result, the cleaning resin 25 can be prevented from leaking from the mating surface 26 of the molding die 28 during cleaning.

Accordingly, since deposition of the cleaning resin 25 on the lateral side of the molding die 28 can be prevented, there are no troubles of removing the same and, as a result, the efficiency of the cleaning operation for the molding die 28 can be improved.

Further, since the cleaning resin 25 can be prevented from leaking from the mating surface 26 of the molding die 28 during cleaning by the use of the cleaning sheet 30 with frame appended with the reinforcing sheet 30c, the cleaning resin 25 can be filled completely into the cavities 6 and concaved portions such as flow cavity recesses 29c (refer to FIG. 8) and, as a result, the cleaning effect for the cavities 6 and the concaved portions such as the cavity recesses 29c can be improved.

The cleaning sheet 30 with frame having the reinforcing sheet 30c is particularly effective in a case where the distance between the outer end of the cavity 6 and the peripheral edge 26a of the mating surface 26 is relatively short in the molding die 28 (for example, 10 mm or less of distance L shown in FIG. 11).

Further, since the cleaning resin 25 can be prevented from leaking from the mating surface of the molding die 28 during cleaning by the use of the cleaning sheet 30 with frame having the reinforcing sheet 30c, the cleaning sheet 30 with frame can be attached to and detached from the mating surface 26 of the molding die 28 easily.

Further, when the cleaning sheet 30a is formed of a non-woven fabric, expansion and shrinkage of the cleaning sheet 30a can be prevented by using the reinforcing sheet 30c and, as a result, the efficiency of the cleaning operation for the molding die 28 can be improved further.

Further, in a case where the resin is injected into the cavity 6 having small gate 13 or air vent 14 in accordance with the size reduction of the package, the constitution of this embodiment described above is effective for preventing lack of filling of the cleaning resin 25 into the cavity 6 by the reason as will be described below.

It is necessary for the cleaning sheet 30a that it has a thickness to some extent and a flexibility to such an extent as not broken when bending since it is necessary to have a strength so as not to be broken upon removing the cleaning resin 25 after mold opening of the molding die 28.

However, when the cleaning sheet 30a of such thickness and flexibility is put in the molding die 28 having small gate 13 or air vent 14, the cleaning sheet 30a may clog the gate 13 or air vent 14 to sometime result in lack of filling to the cavity 6.

Then, for overcoming such a problem, when a relatively thick part such as a frame appended with the reinforcing sheet 30c compared with the cleaning sheet 30a disposed to a portion for the gate 13 and air vent 14 is interposed between to mating surfaces of the molding die 28, as in this embodiment, the pressure for clamping the cleaning sheet 30a at the portion for the gate 13 and air vent 14 can be lowered to prevent clogging in the gate 13 and air vent 14.

Accordingly, lack of filling of the cleaning resin 25 to the cavity 6 can be prevented. Further, the thick part interposed between the mating surfaces 26 of the molding die 28 is not restricted to the constitution of the reinforcing sheet 30c appended to the cleaning sheet 30a described above but it may be, for example, of a constitution being formed separately from the cleaning sheet 30a.

Embodiment 4

Figure 13:
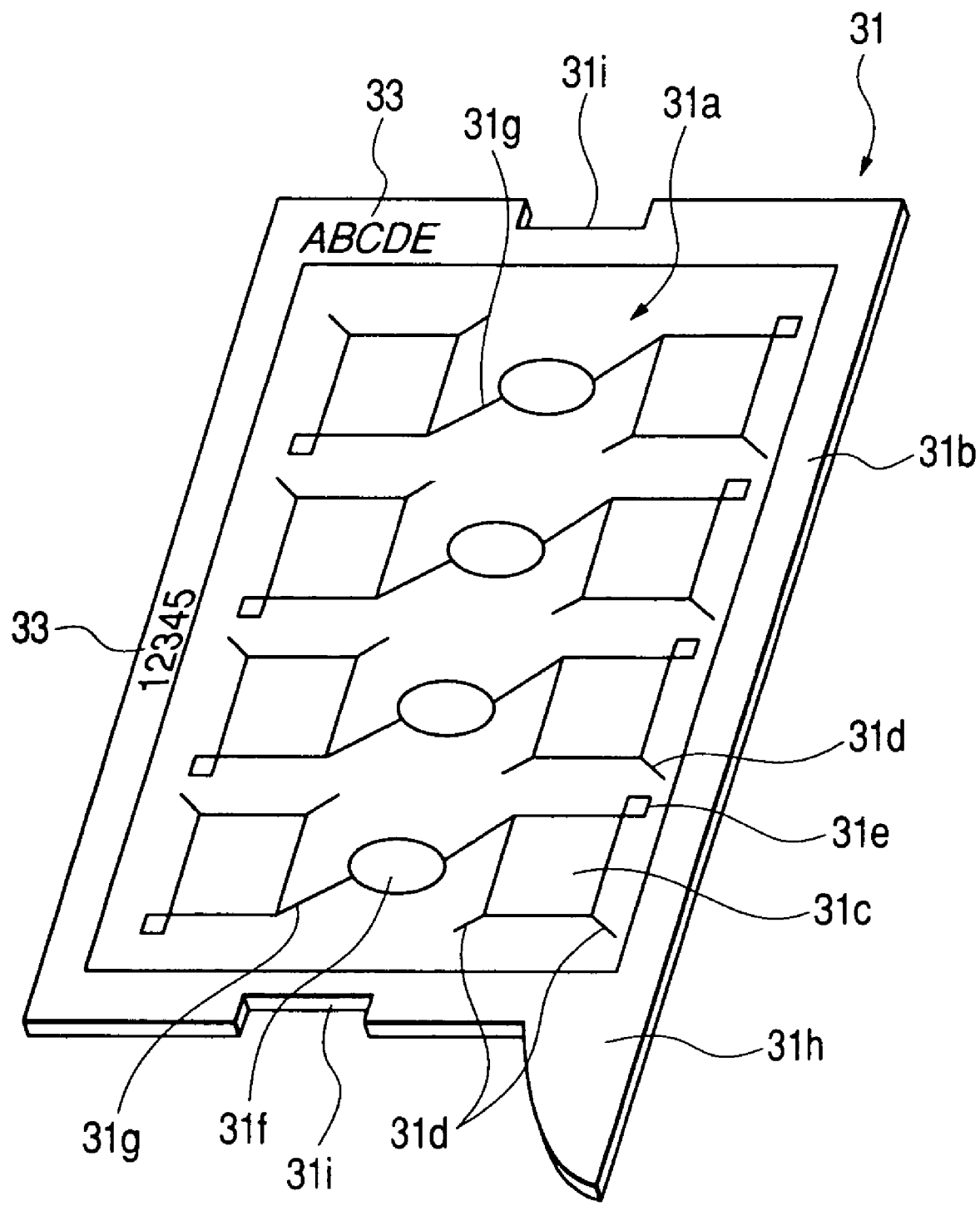
FIG. 13 is a perspective view showing an example for the structure of a molding die cleaning sheet of Embodiment 4 according to this invention.
Figure 14A:
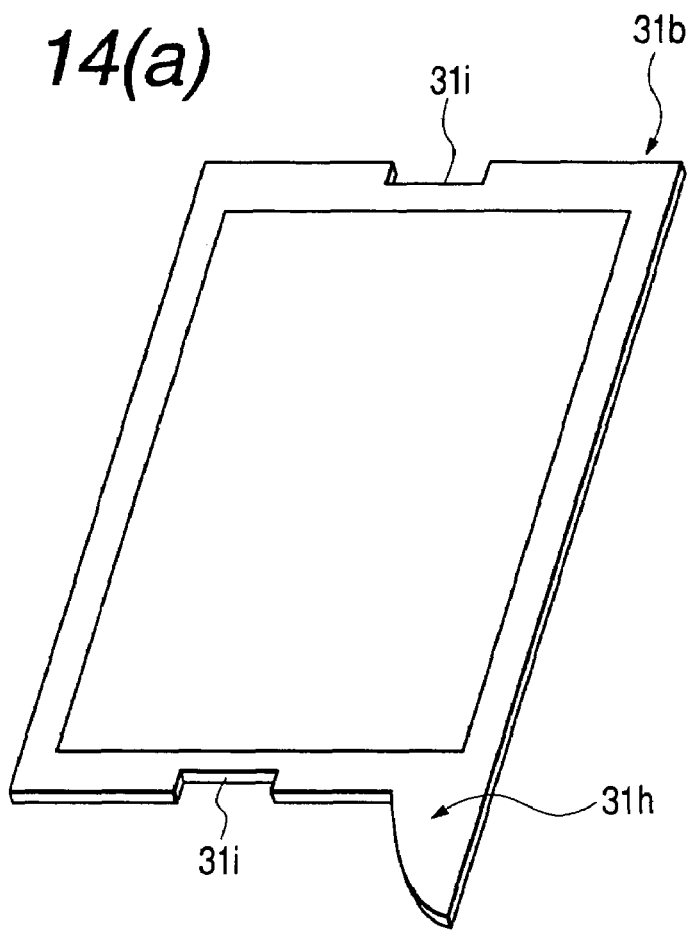
Figure 14B:
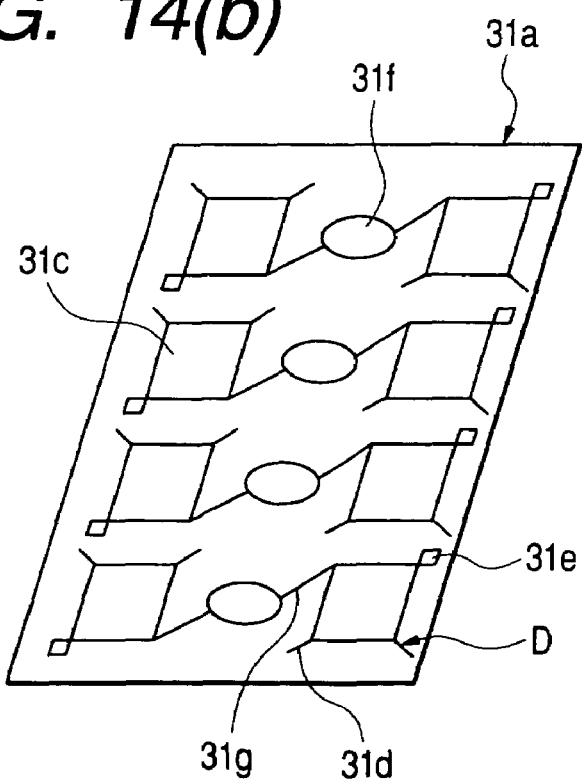
Figure 14C:
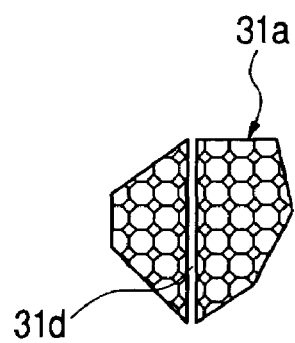
Figure 15:
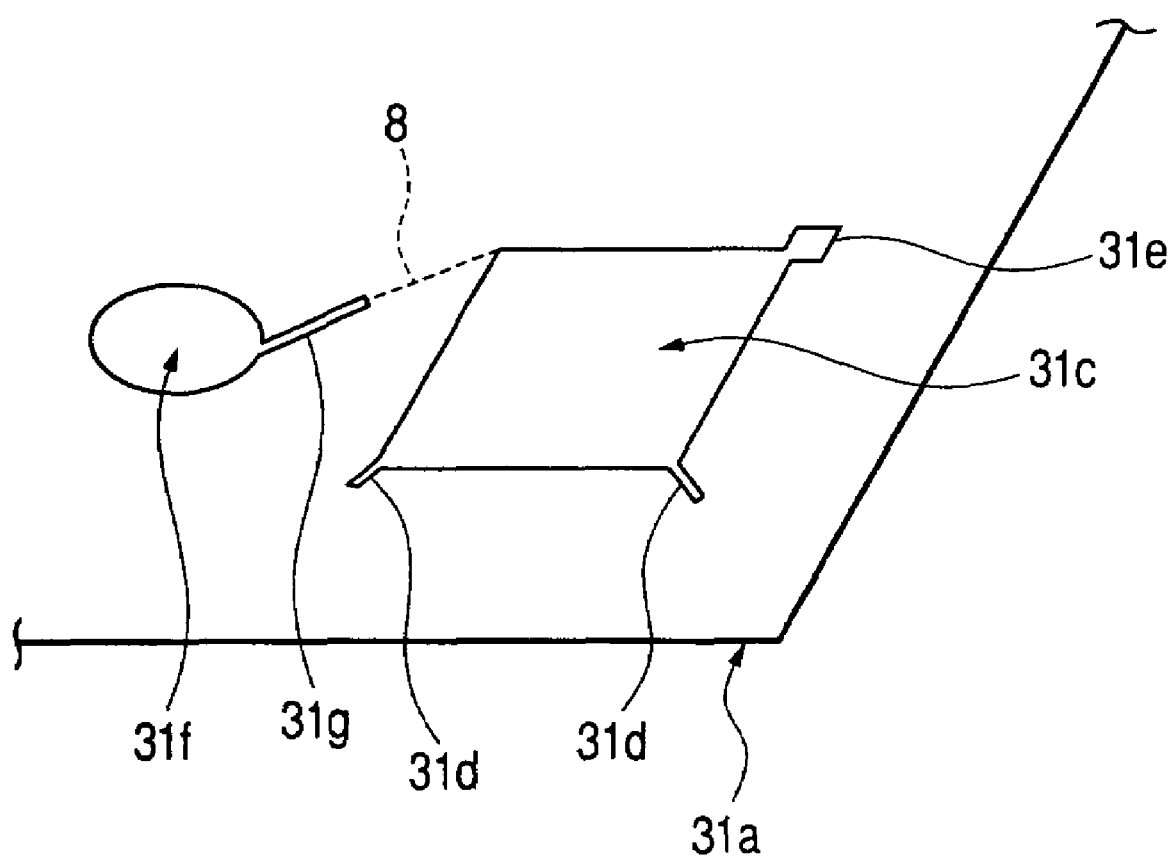
FIG. 15 is an enlarged fragmentary perspective view showing the structure for a molding die cleaning sheet main body as a modified example of the molding die cleaning sheet shown in FIG. 13.
Figure 16A:
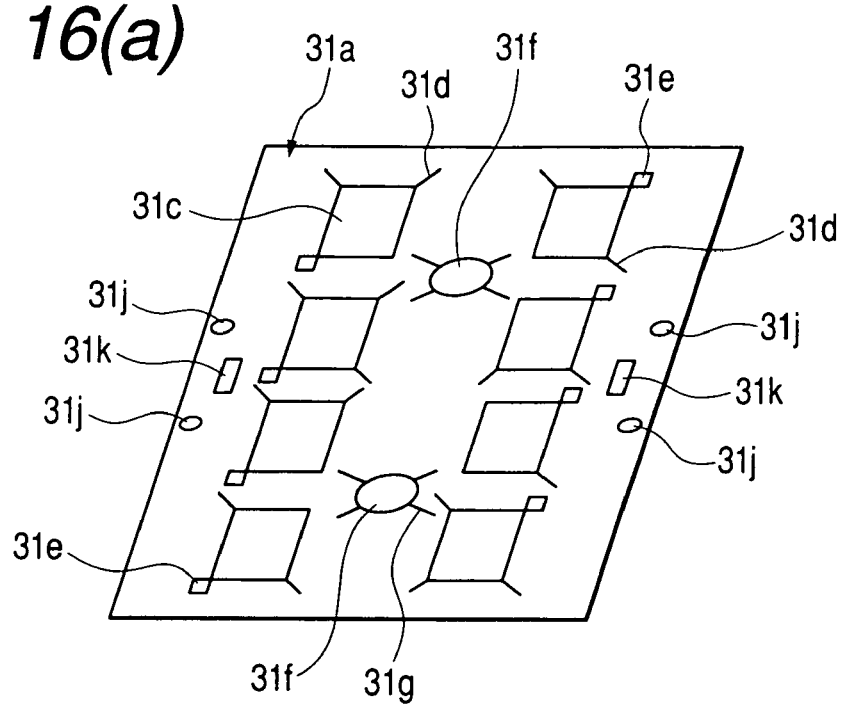
Figure 16B:
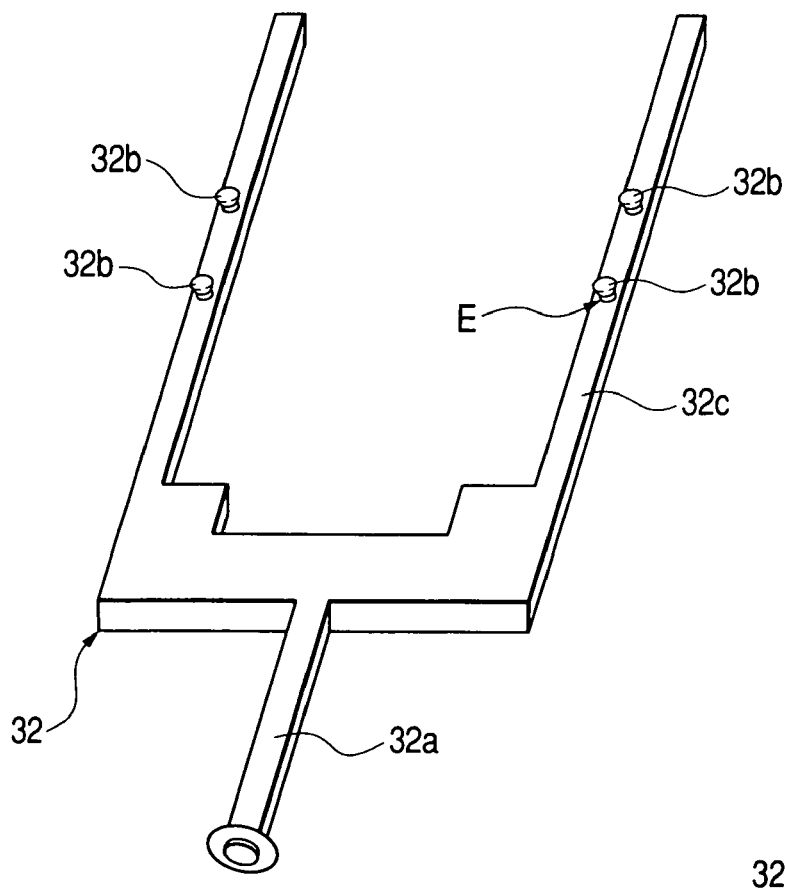
Figure 16C:
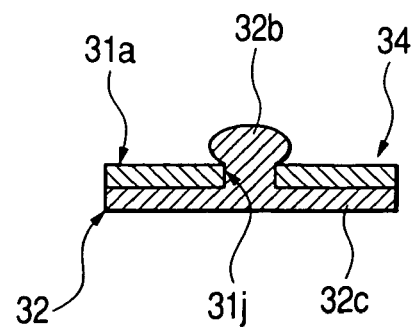
Figure 17:
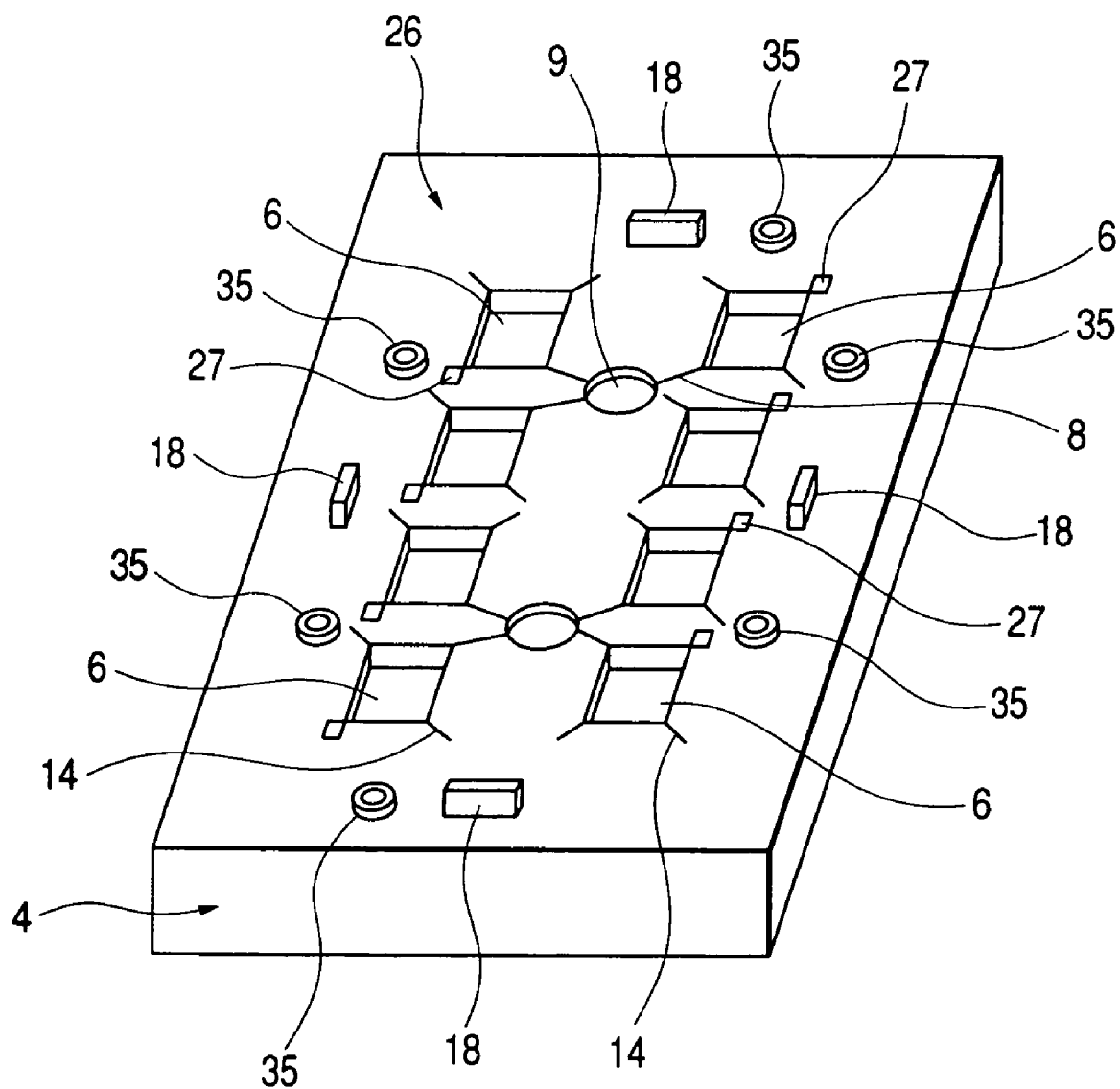
FIG. 17 is a perspective view showing an example for the structure of a second die to be cleaned by the molding die cleaning sheet shown in FIG. 16.
Figure 18:
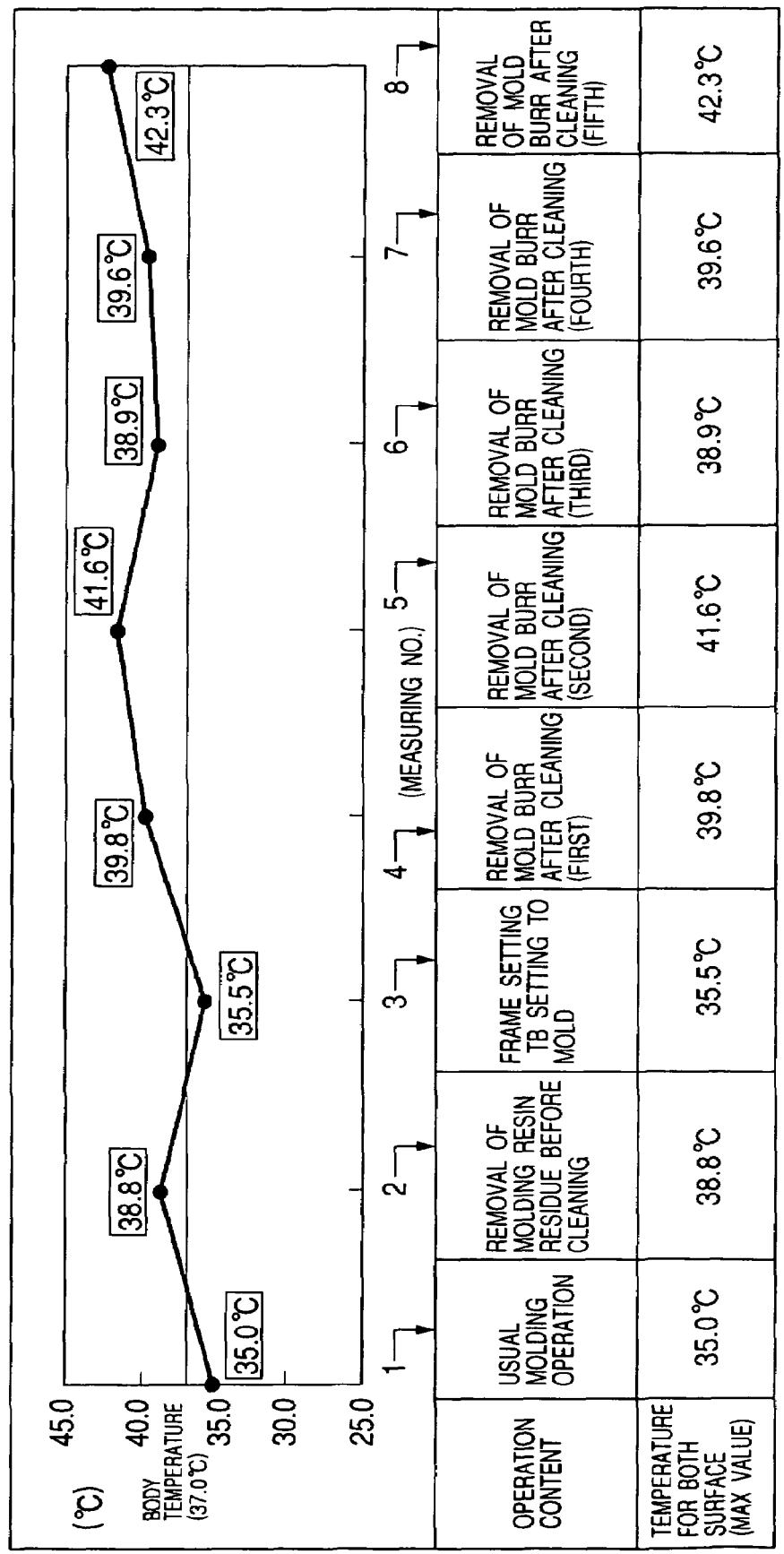
FIG. 18 is a view for the result of temperature measurement showing an example of measured values for the surface temperature of an operator in a usual mold operation and an existent molding die cleaning operation.

FIG. 13 is a perspective view showing an example for the structure of a molding die cleaning sheet in Embodiment 4 according to this invention, FIG. 14 is a view showing a constitution of a molding die cleaning sheet shown in FIG. 13 in which FIG. 14A is a perspective view of a reinforcing frame, FIG. 14B is a perspective of a cleaning sheet main body, FIG. 14C is an enlarged fragmentary plan view showing a portion D in FIG. 14B in an enlarged scale, FIG. 15 is an enlarge fragmentary perspective view showing the structure of a cleaning sheet main body as a modified example to the molding die cleaning sheet shown in FIG. 13, FIG. 16 is a view showing a constitution of a molding die cleaning sheet as a modified example to the molding die cleaning sheet shown in FIG. 13 in which FIG. 16A is an outer perspective view of a cleaning sheet main body, FIG. 16B is an outer perspective view of a reinforcing member and FIG. 16C is a fragmentary enlarged cross sectional view showing a portion E in FIG. 16B in an enlarged scale, FIG. 17 is a perspective view showing an example of a structure of a second mold to be cleaned by the molding die cleaning sheet shown in FIG. 16 and FIG. 18 is a view for the result of showing an example of measured values for the surface temperature of an operator in the usual mold operation and the existent molding die cleaning operation.

In the Embodiment 4, explanation is to be made to a molding die cleaning sheet in which the respective functions of the molding die cleaning sheets explained for Embodiments 1, 2 and 3 are combined and, in addition, slits 31g shown in FIG. 13 corresponding to the runners 8 and second through holes 31f corresponding to the pots 9 of the molding die 28 shown in FIG. 2 are disposed.

That is, a cleaning sheet with frame (molding die cleaning sheet 31) shown in FIG. 13, like the cleaning sheet 17 explained for the Embodiment 1 comprises a cleaning sheet main body 31a that covers the entire mating surface 26 of the molding die 28 when disposed between the first mold 3 and the second mold 4, and a frame-like reinforcing frame (reinforcing member) 31b which can be disposed along the peripheral edge 26a of the mating surface 26 to the outside of the plural cavities 6 of the mating surface 26 of the molding die 28 (refer to FIG. 11).

As shown in FIG. 14B, the cleaning sheet main body 31a is formed with first through holes 31c at positions corresponding to the cavities 6 of the molding die 28, air vent slits (recesses) 31d and flow cavity recesses (recesses) 31e corresponding to the air vents 14 at the corners of the cavities 6, second through holes 31f at positions corresponding to the pots 9 of the molding die 28 and slits 31g at the positions corresponding to the runners 8 of the molding die 28.

On the other hand, as shown in FIG. 14A, the reinforcing frame 31b is formed with an index portion 31h as an extended portion at one of the four corners for indicating the directionality and positioning recess 31i, as recesses to engage the positioning wedges 18 of the molding die 28 for conducting positioning.

The index portion 31h also has a gripping function for handling by an operator and the operator can grip the index portion 31h upon charging into the molding die 28 or upon recovery from the molding die 28.

The reinforcing frame 31b has a thickness, for example, of about 0.5 to 0.6 mm and made of material such as thick paper, thermosetting resin or metal.

Further, the cleaning sheet main body 31a has a thickness, for example, of about 0.45 mm and is formed of a heat resistant and flexible material, for example, 100% paper, cloth and non-woven fabric. Among all, it is preferred to be formed of the non-woven fabric.

Further, the first through hole 31c formed in the cleaning sheet main body 31a has a size substantially identical with or slightly smaller than that of the cavity 6 of the molding die 28.

In the same manner, the second through hole 31a has a size substantially equal with or slightly smaller than that of the pot 9 of the molding die 28.

Then, the cleaning sheet 31 with frame in the Embodiment 4, having the reinforcing frame 31b, increases the clamping force at the outside of the cavity 6 upon clamping of the molding die 28 by the second mold 4 as a lower mold and the first mold 3 as the upper mold upon injection of the cleaning resin 25 (refer to FIG. 5) upon cleaning the molding die 28 as shown in FIG. 12 to prevent the cleaning resin 25 from leaking from the mating surface 26 of the molding die 28.

The cleaning sheet main body 31a and the reinforcing frame 31b are joined not by way of adhesives but preferably by embossing press bonding that utilizes, for example, indent marks 33 such as a product number as shown in FIG. 13.

Thus, since the adhesive or the like is not used, cost for the cleaning sheet 31 with frame can be reduced.

Further, since the rigidity of the cleaning sheet main body 31a can be increased by the reinforcing frame 31b to facilitate charging upon disposition to the molding die 28, the operation efficiency of the cleaning for the molding die can be improved.

Further, as in a cleaning sheet main body 31a of a modified example shown in FIG. 15, a slit 31g corresponding to a runner 8 may be corresponded only to a portion of the runner 8. That is, the slit 31g is not formed above the runner 8 at the vicinity of the cavity 6 shown in FIG. 11 but a not slit part of the cleaning sheet main body 31a is left.

This can prevent that the cleaning sheet main body 31a is disintegrated individually.

Then, a modified example of the cleaning sheet 31 with frame is to be explained.

FIGS. 16A, 16B and 16C show a cleaning sheet with frame (molding die cleaning sheet) 34 comprising a cleaning sheet main body 31a and a reinforcing frame (reinforcing member) 32 with grip 32a.

The reinforcing frame 32 with grip of the cleaning sheet 34 with frame comprises a grip 32a and a sheet support portions 32c and the cleaning sheet main body 31a and the reinforcing frame 32 with grip are joined, for example, as shown in FIG. 16C, by fitting protrusions 32b formed to the sheet support portion 32c of the reinforcing frame 32 with grip and fitting holes 31j formed in the cleaning sheet 31a.

The cleaning sheet main body 31a of the cleaning sheet 34 with frame is formed of wedge escape holes 31k for escaping the positioning wedges 18 or return pins 35 at the mating surface 26 of the second mold 4 shown in FIG. 17.

The functions of the cleaning sheet 34 with frame are identical with those of the cleaning sheet 31 with frame shown in FIG. 13.

Then, when the cleaning is conducted for the molding die 28, the cleaning sheet main body 31a is disposed over the entire mating surface 26 while corresponding the first through holes 31c of the cleaning sheet main body 31a to the cavities 6, the air bent slits 31d or flow cavity recesses 31e to the air vents 14, the slits 31g to a portion of the runners 8 and the second through holes 31f to the pots 9 respectively (of the cleaning sheet main body 31a).

Subsequently, the cleaning sheet main body 31a and the reinforcing frame 31b or the reinforcing frame 32 with grip are clamped between the first mold 3 and the second mold 4 and, further, the cleaning resin 25 is injected into the cavity 6 in this clamped state to fill the cavities 6 with the cleaning resin 25 as shown in FIG. 5.

In this case, the cleaning resin is supplied by way of the runners 8 to the cavities 6 and the cleaning resin 25 is passed through the second through holes 31f, the slits 31g and the first through holes 31c of the cleaning sheet main body 31a into the cavities 6.

Subsequently, the cleaning resin 25 is hardened and the cleaning resin 25 is removed together with the cleaning sheet main body 31a from the mating surface 26 of the molding die 28 to conduct cleaning for the molding die 28.

Location of the cleaning sheet 31, 34 with frame to the molding die 28 and taking out of the sheet from the molding die 28 may be conducted by operator's manual operation, or by an automatic apparatus using a loader and an unloader. In the case of using the automatic apparatus, the reinforcing frame 31b or the reinforcing frame 32 with grip may be saved.

Further, by changing the thickness of the reinforcing frame 31b or the reinforcing frame 32 with grip in the cleaning sheet with frame 31, 34, the amount of leakage of the resin (cleaning resin 25) in the mating surface 26 at the periphery of the openings of the cavities 26 of the molding die 28 can be adjusted.

Further, there are no particular restrictions on the width, length and shape of the recess in the slit 31g corresponding to the runner 8, air vent sheet 31d corresponding to the air vent 14 and the flow cavity recess 31e.

In the Embodiment 4, since the second through holes 31f of the cleaning sheet main body 31a are disposed corresponding to the pots of the molding die 26, flow of the cleaning resin 25 in the culls and the pots 9 of the molding die 28 can be made smooth, when conducting cleaning for the molding die 28 using the cleaning sheet with frame 31, 34.

Particularly, resistance to the flow at the initial stage of injecting the cleaning resin 25 can be eliminated.

Accordingly, since the cleaning resin can be filled completely in the culls 7 upon cleaning the molding die 28, obstacles on the mating surface 26 at the periphery of the pots 9 or the culls 7 can be removed reliably.

Further, since the cleaning sheet main body 31a is provided with the slits 31 corresponding to the runners 8 and the first through holes 31c corresponding to the cavities 6, the air vent slits 31d and the flow cavity recesses 31e corresponding to the air vents 14 flow of the cleaning resin 25 at each of the portions is not hindered but made smooth, so that the cleaning resin 25 can be filled reliably by way of the runners into the cavities 6 and the air vents 14, and obstacles in the runner 8 cavity 6 and the air vent 14 can be removed reliably.

As a result, the cleaning effect for the molding die 28 can be improved.

Further, FIG. 18 shows the result of measurement for the surface temperature of an operator's body in usual molding operation and cleaning operation. It can be seen that while the temperature is 35.0° C. during usual mold operation, the temperature is higher by about 3 to 5° C. than 35.0° C. substantially for the entire period during cleaning operation (measurement No. 2-8).

Accordingly, in a case where the cleaning sheet 31, 34 with frame of the Embodiment 4 is used, since the operation of removing mold burrs (mainly in culls 7 or air vents 14) is not required, this extremely shorten the access period of the operator to a heat source (mold)

As a result, the cleaning operation for the molding die 28 conducted by an operator can be mitigated greatly and the operation environment can be enhanced greatly.

The invention made by the present inventors has been explained specifically with reference to the embodiments of the invention but this invention is not restricted only to the embodiments of the invention described previously and it will be apparent that various modifications are possible within a range not departing the gist of the invention.

For example, while the Embodiments 1, 2, 3 and 4 have been explained to the case where the cleaning sheet 17, 29 or 30a and the cleaning sheet main body 31a are formed of the non-woven fabric, a material for the cleaning sheet 17, 29 or 30a and the cleaning sheet main body 31a is not restricted only to the non-woven fabric but paper or other cloth may also be used.

Also, the thickness for the cleaning sheet 17, 29, 30a and the cleaning sheet main body 31a is not restricted only to those explained for the Embodiments 1, 2, 3 and 4 but those of various thickness may be used.

Further, the size of the cleaning sheet 17, 29 or 30a and the cleaning sheet main body 31a may also be somewhat smaller than that of the mating surface 26 so long as the sheet has a size covering the mating surface 26 of the molding die 28 substantially entirely.

Further, the shape and the number of the through holes 17a, 29a, 30b or first through hole 31c, the second through hole 31f formed to the cleaning sheet 17, 29 or 30a and the cleaning sheet main body 31a are not restricted to those of the Embodiments 1, 2, 3 and 4 but various shapes or numbers of them may be used. Further, also with respect to the size, it may suffice that the size is substantially identical with the opening 6a of the cavity 6 or the pot 9, or the size may be of such an extent as capable of passing the cleaning resin 25 therethrough.

The molding die 28 for the Embodiments 1, 2, 3 and 4 may be of a series in one row of lead frames, or a matrix frame and the cost for the cleaning operation can be reduced in any of the cases.

Further, the Embodiments 1 and 2 have been explained to a case where the semiconductor device molded by the transfer molding apparatus shown in FIG. 1 is the QFP. 19 shown in FIG. 6. However, the semiconductor device is not restricted only to the QFP 19 but the invention may be applied to SOP or like other semiconductor device so long as the semiconductor device is molded as and assembled in the transfer molding apparatus.

Further, while the molding die 28 in the Embodiments 1, 2, 3 and 4 has been described as having a first mold 3 as an upper mold and the second mold 4 as a lower mold but on the contrary, the first mold 3 may be a lower mold while the second mold 4 may be an upper mold.

The effect obtained by typical inventions among those disclosed in the present application are to be explained briefly as below.

Since through holes corresponding to the cavities, through holes corresponding to the pots or slits corresponding to the runners are formed in the molding die cleaning sheet, the cleaning resin can be prevailed throughout the cavities to improve the cleaning effect for the molding die.

What is claimed is:

1. A method of manufacturing a semiconductor device by using a cleaning sheet for cleaning a molding die, comprising the steps of:
   (a) providing the molding die having a first mold, a second mold opposing to the first mold, the second mold having pots, cavities arranged around the pots, and runners arranged between the pots and the cavities, wherein the first mold has a first main surface, wherein the second mold has a second main surface opposing to the first main surface, wherein the pots are formed on the second main surface of the second mold, and wherein the cavities are connected with the pots by way of the runners, respectively
   (b) providing the cleaning sheet having an opening, wherein a planar shape of the cleaning sheet is a frame shape;
   (c) disposing cleaning resin into the pots, respectively;
   (d) disposing the cleaning sheet between the first mold and the second mold such that the pots, the runners and the cavities are arranged inside of the opening of the cleaning sheet in a plane view;
   (e) clamping the cleaning sheet with the first main surface of the first mold and the second main surface of the second mold;
   (f) supplying the cleaning resins into the cavities from the pots by way of the opening of the cleaning sheet and the runners, respectively;
   (g) hardening the cleaning resins;
   (h) releasing the cleaning sheet from between the first mold and the second mold, wherein the hardened cleaning resin is attached to the cleaning sheet;
   (i) disposing encapsulating resin into the pots;
   (j) disposing semiconductor chips in the cavities, respectively; and
   (k) supplying the encapsulating resin into the cavities from the pots by way of the runners, respectively.

2. The method of manufacturing the semiconductor device according to claim 1, wherein the cleaning sheet is comprised of paper which is not capable of being impregnated or permeated with the cleaning resin.

3. The method of manufacturing the semiconductor device according to claim 1, wherein before the step (j), the semiconductor chips are mounting over a leadframe having a plurality of leads, and are electrically connected with the plurality of leads by way of wires.

4. The method of manufacturing the semiconductor device according to claim 2, wherein before the step (j), the semiconductor chips are mounting over a leadframe having a plurality of leads, and are electrically connected with the plurality of leads by way of wires.

5. The method of manufacturing the semiconductor device according to claim 1, wherein the cavities are formed on the first main surface of the first mold and the second main surface of the second mold; and
   wherein the cavities formed on the first mold are arranged at a portion opposing to the cavities formed on the second mold.

6. The method of manufacturing the semiconductor device according to claim 1, wherein in the step (e), the cleaning sheet is clamped with a peripheral portion of the first main surface of the first mold and a peripheral portion of the second main surface of the second mold.

* * * * *